(12) United States Patent
Sato

(10) Patent No.: US 6,573,157 B1
(45) Date of Patent: Jun. 3, 2003

(54) METHOD OF MANUFACTURING SEMICONDUCTOR DEVICE, NARROW PITCH CONNECTOR, ELECTROSTATIC ACTUATOR, PIEZOELECTRIC ACTUATOR, INK JET HEAD, INK JET PRINTER, MICROMACHINE, LIQUID CRYSTAL PANEL, AND ELECTRONIC DEVICE

(75) Inventor: Eiichi Sato, Suwa (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 09/701,300

(22) PCT Filed: Mar. 31, 2000

(86) PCT No.: PCT/JP00/02072
§ 371 (c)(1),
(2), (4) Date: Dec. 13, 2000

(87) PCT Pub. No.: WO00/59050
PCT Pub. Date: Oct. 5, 2000

(30) Foreign Application Priority Data

Mar. 31, 1999 (JP) .............................. 11-094074

(51) Int. Cl.[7] .............................. H01L 21/301
(52) U.S. Cl. .................. 438/462; 438/460; 438/106; 438/313; 438/80; 438/118
(58) Field of Search ................... 438/462, 460, 438/106, 313, 9, 622, 612, 458, 107, 464, 80, 67, 455, 461, 118, 113, 114

(56) References Cited

U.S. PATENT DOCUMENTS 4,219,835 A * 8/1980 Van Loon et al. .......... 257/330
5,314,844 A * 5/1994 Imamura .................... 438/460

FOREIGN PATENT DOCUMENTS

| JP | 61-115332 | 6/1986 |
|---|---|---|
| JP | 62-209828 | 9/1987 |
| JP | 2-100340 | 4/1990 |
| JP | 3-152955 | 6/1991 |
| JP | 4-23451 | 1/1992 |
| JP | 5-259274 | 10/1993 |
| JP | 8-64557 | 3/1996 |
| JP | 9-91388 | 4/1997 |
| JP | 10-106695 | 4/1998 |
| JP | 11-507468 | 6/1999 |
| WO | WO 96/31921 | 10/1996 |

OTHER PUBLICATIONS

Silicon Processing for the VLSI Era, vol. 1, Wolf et al. Lattice Press, pp. 2–3.*

* cited by examiner

Primary Examiner—Matthew Smith
Assistant Examiner—Igwe U. Anya
(74) Attorney, Agent, or Firm—Oliff & Berridge, PLC.

(57) ABSTRACT

A manufacturing method of semiconductor devices, micromachines such as semiconductor device, narrow pitch connectors, electrostatic actuators or piezoelectric actuators, and ink jet heads, ink jet printers, liquid crystal panels, and electronic appliances, including them characterized in that short circuit due to dusts floating in the air will not take place. In a method where a silicon wafer (30) undergoes dicing to manufacture semiconductor devices (20), a groove (30a) covered by an insulating layer and spanning a dicing line is formed in the above described silicon wafer, and the silicon wafer undergoes dicing along the dicing line.

3 Claims, 21 Drawing Sheets

(e)

(f)

(g)

(a)

(b)

(a)

(b)

(c)

(A)

(B)

(A)

(B)

METHOD OF MANUFACTURING SEMICONDUCTOR DEVICE, NARROW PITCH CONNECTOR, ELECTROSTATIC ACTUATOR, PIEZOELECTRIC ACTUATOR, INK JET HEAD, INK JET PRINTER, MICROMACHINE, LIQUID CRYSTAL PANEL, AND ELECTRONIC DEVICE

TECHNICAL FIELD

The present invention relates to a manufacturing method of a semiconductor device, a semiconductor device, a connector for a narrow pitch, an electrostatic actuator including this connector for a narrow pitch, a piezoelectric actuator, a micromachine, a liquid crystal panel, and an ink jet head using these electrostatic actuator and piezoelectric actuator, an ink jet printer on which these ink jet heads are mounted, and electronic appliances.

BACKGROUND ART

Conventionally, known is a method in which an insulating layer is formed on the surface of single crystal silicon wafer (hereinafter to be referred to as silicon wafer) and the upper surface of this insulating layer undergoes the CVD method (or spattering) and etching so that wirings, etc. are formed, and thus a semiconductor device is manufactured.

FIG. 23 is a plan view of a silicon wafer in which a semiconductor device has been formed, and FIG. 24 is a sectional view along a line A—A in FIG. 23 showing the main portion thereof which has been enlarged.

On the surface of a silicon wafer 1, as shown in FIG. 23, a number of semiconductor devices 3 are formed and sandwiching dicing lines 5 shaping an lattice. The semiconductor device 3 shown herein has an IC7 formed on the insulating layer 4 of the silicon wafer 1 and a micro-wiring 9 drawn out from this IC7.

Thus, a number of semiconductor devices 3 formed on the surface of the silicon wafer 1 are, as shown in FIG. 25, cut out into chips by a cutter 11 such as diamond blade or rotating thin whetstone called dicing blade along the dicing lines 5.

The semiconductor devices 3 cut out into chips are brought into electrical and mechanical connection with an external substrate via a flexible substrate (connector) made of, for example, polyimide. Incidentally, connection between a terminal electrode of the semiconductor device 3 and an electrode of the flexible substrate is implemented by pressuring and heating by way of an anisotropy conductive adhesive containing conductive particles, etc.

However, the semiconductor substrate to be manufactured as described above gives rise to following problems.

FIGS. 26(A) and (B) are enlarged views showing the main portions of the semiconductor device 3 cut out from the silicon wafer 1. As shown in FIG. 26(A), cutting out the semiconductor device 3 will cause the single crystal surface of silicon to be exposed on an end surface 1a along the dicing line. In addition, an insulating layer 4 formed on the surface of the silicon wafer 1 has thickness no more than around 5000 to 20000 angstroms. Therefore, there was a possibility that a conductive dust 13 floating in the air comes into attachment so as to span the insulating layer 4 as shown in FIG. 26(A) so that the quasi-micro wiring 9 and the end surface la are short-circuited (edge short).

In addition, there was also a possibility that the soldering material or conductive adhesive 15 used for connection between IC7 and micro-wiring 9 starts flowing out to reach the end surface 1a as shown in FIG. 26(B) so that short circuit (edge short) could take place.

In the surface of the semiconductor device 3, the portions other than the micro-wiring 9 are covered by the insulating layer 4. Thus, there was also a possibility that in the case where static electricity takes place in the air, static electricity is charged into the micro-wiring 9 of the semiconductor device 3, which is repeated so that the micro-wiring 9 was fused.

Incidentally, the semiconductor device includes for example a micromachine such as a piezoelectric actuator, electrostatic actuator, etc., a micromachine, etc., which is configured by connecting a semiconductor device in which an IC is disposed on a narrow pitch connector, and liquid crystal panel, etc.

DISCLOSURE OF THE INVENTION

An object of the present invention is to provide a manufacturing method of semiconductor devices in that short circuit will not take place due to dusts floating in the air, micromachines such as semiconductor device, narrow pitch connectors, electrostatic actuators, piezoelectric actuators, or the like, ink jet heads including them, ink jet printers, liquid crystal panels, and electronic appliances.

(1) A manufacturing method of semiconductor devices related to one aspect of the present invention is a manufacturing method of semiconductor devices in which a silicon wafer undergoes dicing to manufacture plural semiconductor devices, characterized in that, a groove covered by an insulating layer and spanning a dicing line is formed in the above described silicon wafer, and the above described silicon wafer undergoes dicing along the above described dicing line.

According to the above described manufacturing method, an insulating layer is formed on an outer periphery surface of a semiconductor device. Therefore, conductive dusts, which could adhere to the periphery section of the semiconductor device, will be blocked by the insulating layer formed on the outer periphery surface and will not reach the silicon crystal face. Therefore, short circuit will not take place.

In addition, soldering material or conductive adhesive to mount elements could flow out, but will be blocked by the insulating layer formed on the outer periphery surface and will not reach the silicon crystal face. Therefore, in this case too, short circuit will not take place.

(2) The manufacturing method of semiconductor device related to another aspect of the present invention is, in the above described (1), characterized in that a metal film is formed on an insulating layer after the insulating layer is formed on the bottom surface of the above described groove.

With such an arrangement, the static electricity in the air is charged into this metal film so that the semiconductor elements or wiring sections can be prevented from being charged with the static electricity. In addition, if a person who is charged with static electricity or a metal which is charged with static electricity comes into contact with a semiconductor device, the transferred static electricity is charged into the metal film so that the semiconductor elements or the wiring section can be prevented from being charged with the static electricity.

(3) A manufacturing method of the semiconductor device related to another aspect of the present invention is, in the above described (2), characterized in that the above described metal film is brought into conduction to a crystal face of the above described silicon wafer.

By such an arrangement, if a device grasping the semiconductor substrate is grounded in an assembly line, or the crystal face is grounded after assembly, the metal film can be charged with static electricity and the charged static electricity can be caused to flow, so that bad influence by static electricity can be surely prevented.

(4) A manufacturing method of the semiconductor device related to another aspect of the present invention is, in the above described (1) to (3), characterized in that the crystal face on the surface of the above described silicon wafer is the (110)-plane and the groove is formed by implementing anisotropy etching on the (110)-plane.

By an arrangement in which the (110)-plane undergoes anisotropy etching, the depth of the groove to be formed can be set freely. Thereby, the groove can be formed to have a depth corresponding to the size (length) of the dusts expected to adhere, or viscosity and quantity of the soldering material or conductive adhesive agent to be used for mounting elements.

(5) A manufacturing method of the semiconductor device related to another aspect of the present invention is, in the above described (1) to (3), characterized in that the crystal face on the surface of the above described silicon wafer is the (100)-plane, and the groove is formed by implementing anisotropy etching on the (100)-plane.

If the (100)-plane is arranged to undergo anisotropy etching, the groove can be V-shaped. Therefore, when a semiconductor device is cut out into a chip, an inclined insulating layer will be formed in the circumference of the semiconductor device so that dusts and dirt generated at the time of dicing can be easily removed.

(6) The semiconductor device related to another aspect of the present invention is characterized in that an insulating layer is formed on the outer periphery surface of a substrate in which elements are formed.

Since the insulating layer is formed on an outer periphery surface of a semiconductor device, a conductive dust, which happens to adhere to the circumference of the semiconductor device, will be blocked by the insulating layer formed on the outer periphery surface and will not reach the substrate surface. Therefore, no short circuit will take place.

In addition, soldering material or conductive adhesive to mount elements could flow out, but will be blocked by the insulating layer formed on the outer periphery surface and will not reach the substrate surface. Accordingly, also in this case no short circuit will take place.

(7) The semiconductor device related to another aspect of the present invention is, in the above described (6), characterized in that an inclined section is formed on the above described outer periphery surface.

Since the inclined section is formed in the circumference of the semiconductor device, the dusts and dirt that adhere to the periphery section of the semiconductor device can be easily removed.

(8) The semiconductor device related to another aspect of the present invention is, in the above described (6), characterized in that a step section is formed on the outer periphery surface.

(9) The narrow pitch connector related to another aspect of the present invention is a connector for a narrow pitch comprising a substrate on which first terminal electrodes, second terminal electrodes and wiring electrically connecting the first terminal electrodes with the second terminal electrodes are formed, the wiring having a function of making conversion from the pitch of the first terminal electrodes to the pitch of the second terminal electrodes and is characterized in that an insulating layer is formed on the outer periphery surface of the substrate.

Since the insulating layer is formed on the outer periphery surface of the substrate of the narrow pitch connector, a conductive dust, which happens to adhere to the circumference of the substrate, will be blocked by the insulating layer formed on the outer periphery surface and will not reach the crystal face. Therefore, no short circuit will take place.

In addition, soldering material or conductive adhesive used at the time when the narrow pitch connector is brought into junction with a connection object or outside of the substrate could flow out, but will be blocked by the insulating layer and will not reach the crystal face. Accordingly, also in this case no short circuit will take place.

(10) The narrow pitch connector related to another aspect of the present invention is, in the above described (9), characterized in that the outer periphery surface has an inclined section.

Since the inclined section is formed on the outer periphery surface of the substrate of the narrow pitch connector, the dusts and dirt that adhere to the narrow pitch connector can be easily removed.

(11) The narrow pitch connector related to another aspect of the present invention is, in the above described (9), characterized in that the outer periphery surface has a step section.

(12) The narrow pitch connector related to another aspect of the present invention is, in the above described (9) to (11), characterized in that a metal film is formed on the insulating layer.

With such an arrangement, the static electricity in the air is charged into the metal film so that the micro-wiring section of the narrow pitch connector can be prevented from being charged with the static electricity. In addition, even in a case where a person who is charged with static electricity or a metal which is charged with static electricity comes into contact with a semiconductor device, the transferred static electricity is charged into the metal film so that the semiconductor elements or the wiring section can be prevented from being charged with the static electricity.

(13) The narrow pitch connector related to another aspect of the present invention is, in the above described (12), characterized in that the metal film is brought into conduction to the substrate.

By such an arrangement, if a device grasping the narrow pitch connector is grounded in an assembly line, or the crystal substrate is grounded after assembly, the metal film can be charged with static electricity and the charged static electricity can be caused to flow, so that bad influence by static electricity can be surely prevented.

(14) The narrow pitch connector related to another aspect of the present invention is, in the above described (9) to (13), characterized in that the connector has characteristics that the thermal expansion coefficient of the substrate is approximately equivalent to the thermal expansion coefficient of a connection object to be connected, or smaller than the thermal expansion coefficient of the connection object.

Thus, with the thermal expansion coefficient of the substrate being made approximately equivalent to the thermal expansion coefficient of the connection object, when the terminal electrodes are connected by being subjected to pressure and heat, deviation of relative positions between the terminal electrodes to be connected can be controlled to minimum.

In addition, in the case where the thermal expansion coefficient of the substrate is made smaller than the thermal expansion coefficient of the connection object, the substrate is arranged to be connected at a higher temperature than the connection object so that a similar effect is obtainable.

(15) The narrow pitch connector related to another aspect of the present invention is, in the above described (9) to (14), characterized in that the substrate is formed of single crystal silicon.

The substrate formed of single crystal silicon can improve radiation effects and prevent increase in resistant value due to temperature rise.

(16) The narrow pitch connector related to another aspect of the present invention is, in the above described (15), characterized in that the crystal face of the single crystal silicon is (100)-plane.

With the crystal face of single crystal silicon being (100)-plane, if the surface undergoes anisotropy etching, a V-groove having an angle of 54.74 degree to the surface can be formed. Incidentally, the depth of the V groove can be accurately controlled by the width of the window (for example made of $SiO_2$ film) set on the (100)-plane.

(17) The narrow pitch connector related to another aspect of the present invention is, in the above described (15), characterized in that the crystal face of the single crystal silicon is (110)-plane.

With the crystal face of single crystal silicon being (110)-plane, if the surface undergoes anisotropy etching, a groove having a rectangular section can be formed. In this case, regardless of the groove width, a groove having predetermined depth can be formed.

(18) A micromachine related to another aspect of the present invention, including an active mechanism and a first substrate having first terminal electrodes is characterized in that the micromachine further includes a second substrate having second terminal electrodes to be electrically connected to the first terminal electrodes, the second substrate further has third terminal electrodes and wiring electrically connecting the second terminal electrodes with the third terminal electrodes, the wiring has a function of making conversion from the pitch of the second terminal electrodes to the pitch of the third terminal electrodes, and the outer periphery surface of the second substrate has an insulating layer formed thereon.

(19) A piezoelectric actuator related to another aspect of the present invention, including a piezoelectric element and a first substrate having first terminal electrodes, is characterized in that the piezoelectric actuator further includes a second substrate having second terminal electrodes to be electrically connected to the first terminal electrodes, the second substrate further has third terminal electrodes and wiring electrically connecting the second terminal electrodes with the third terminal electrodes, the wiring has a function of making conversion from the pitch of the second terminal electrodes to the pitch of the third terminal electrodes, and the outer periphery surface of the second substrate has an insulating layer formed thereon.

(20) An electrostatic actuator related to another aspect of the present invention, including an electrostatic oscillator and a first substrate having first terminal electrodes, is characterized in that the electrostatic actuator further includes a second substrate having second terminal electrodes to be electrically connected to the first terminal electrodes, the second substrate further has third terminal electrodes and wiring connecting the second terminal electrodes with the third terminal electrodes, the wiring has a function of making conversion from the pitch of the second terminal electrodes to the pitch of the third terminal electrodes, and the outer periphery surface of the second substrate has an insulating layer formed thereon.

(21) An ink jet head related to another aspect of the present invention, including a piezoelectric element and a first substrate having first terminal electrodes, to spill out ink drops by the piezoelectric element, is characterized in that the ink jet head further includes second substrate having second terminal electrodes to be electrically connected to the first terminal electrodes, the second substrate further has third terminal electrodes and wiring electrically connecting the second terminal electrodes with the third terminal electrodes, the wiring has a function of making conversion from the pitch of the second terminal electrodes to the pitch of the third terminal electrodes, and the outer periphery surface of the second substrate has an insulating layer formed thereon.

(22) An ink jet head related to another aspect of the present invention, including an electrostatic oscillator and a first substrate having first terminal electrodes, to spill out ink drops by the electrostatic oscillator, is characterized in that the ink jet head further includes a second substrate having second terminal electrodes to be electrically connected to the first terminal electrodes, and the second substrate further has third terminal electrodes and wiring electrically connecting the second terminal electrodes with the third terminal electrodes, the wiring has a function of making conversion from the pitch of the second terminal electrodes to the pitch of the third terminal electrodes, and the outer periphery surface of the second substrate has an insulating layer formed thereon.

(23) An ink jet printer related to another aspect of the present invention, comprising an ink jet head including a piezoelectric element and a first substrate having first terminal electrodes, is characterized in that the ink jet head further includes a second substrate having second terminal electrodes to be electrically connected to the first terminal electrodes, the second substrate further has third terminal electrodes and wiring electrically connecting the second terminal electrodes with the third terminal electrodes, the wiring has a function of making conversion from the pitch of the second terminal electrodes to the pitch of the third terminal electrodes, and the outer periphery surface of the second substrate has an insulating layer formed thereon.

(24) An ink jet printer related to another aspect of the present invention, comprising an ink jet head including an electrostatic oscillator and a first substrate having first terminal electrodes is characterized in that the ink jet head further includes a second substrate having second terminal electrodes to be electrically connecting to the first terminal electrodes, the second substrate further has third terminal electrodes and wiring electrically connecting the second terminal electrodes with the third terminal electrodes, the wiring has a function of making conversion from the pitch of the second terminal electrodes to the pitch of the third terminal electrodes, and the outer periphery surface of the second substrate has an insulating layer formed thereon.

In the above described inventions of (18) to (24), since the insulating layer is formed on the outer periphery surface of the second substrate, a conductive dust, which happens to adhere to the circumference of the second substrate, will be blocked by the insulating layer formed on the outer periphery surface and will not reach the conductive surface. Therefore, no short circuit will take place.

In addition, soldering material or conductive adhesive used to connect the second substrate with a connection object or outside of the substrate, could flow out, but will be blocked by the insulating layer and will not reach the conductive surface. Accordingly, also in this case no short circuit will take place.

(25) A liquid crystal device related to another aspect of the present invention, including a first substrate and a second substrate sandwiching a liquid crystal between them, and first terminal electrodes formed in either of the first substrate and the second substrate, is characterized in that the liquid crystal device further includes a third substrate having second terminal electrodes to be electrically connected to the first terminal electrodes, the third substrate further has third terminal electrodes and wiring electrically connecting the second terminal electrodes with the third terminal electrodes, the wiring has a function of making conversion from the pitch of the second terminal electrodes to the pitch of the third terminal electrodes, and the outer periphery surface of the third substrate has an insulating layer formed thereon.

(26) An electronic appliance related to another aspect of the present invention, including a liquid crystal device, is characterized in that the liquid crystal device has a first substrate and a second substrate, a liquid crystal is sandwiched between the first substrate and the second substrate, and first terminal electrodes are formed in either of the first substrate and the second substrate; the liquid crystal device further has a third substrate having second terminal electrodes to be electrically connected to the first terminal electrodes; the third substrate further has third terminal electrodes and wiring electrically connecting the second terminal electrodes with the third terminal electrodes; the wiring has a function of making conversion from the pitch of the second terminal electrodes to the pitch of the third terminal electrodes; and the outer periphery surface of the third substrate has an insulating layer formed thereon.

In the above described invention of (25) or (26), since the insulating layer is formed on the outer periphery surface of the third substrate, a conductive dust, which happens to adhere to the circumference of the third substrate, will be blocked by the insulating layer formed on the outer periphery surface and will not reach the crystal face. Therefore, no short circuit will take place.

In addition, the soldering material or the conductive adhesive used to connect the third substrate with the first substrate or the second substrate, could flow out, but will be blocked by the insulating layer and will not reach the crystal face. Accordingly, also in this case no short circuit will take place.

BRIEFLY DESCRIBE OF THE DRAWINGS

FIG. 1 is a front view showing a connector for a narrow pitch related to a Embodiment 1 of the present invention and a terminal portion of an object for connection with which this connector is connected;

FIGS. 2(A) and 2(B) are enlarged sectional views of a circumference portion in the connector for a narrow pitch related to a Embodiment 1 of the present invention;

Figure 15:
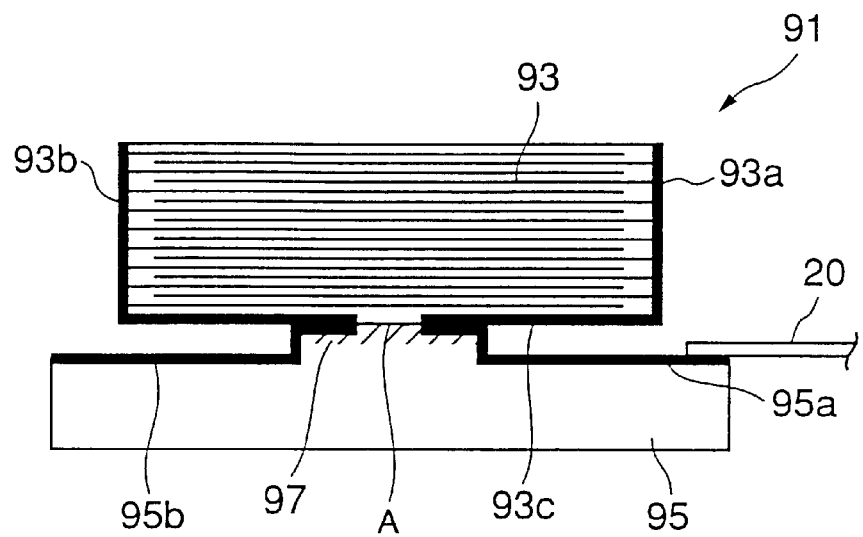
Figure 16:
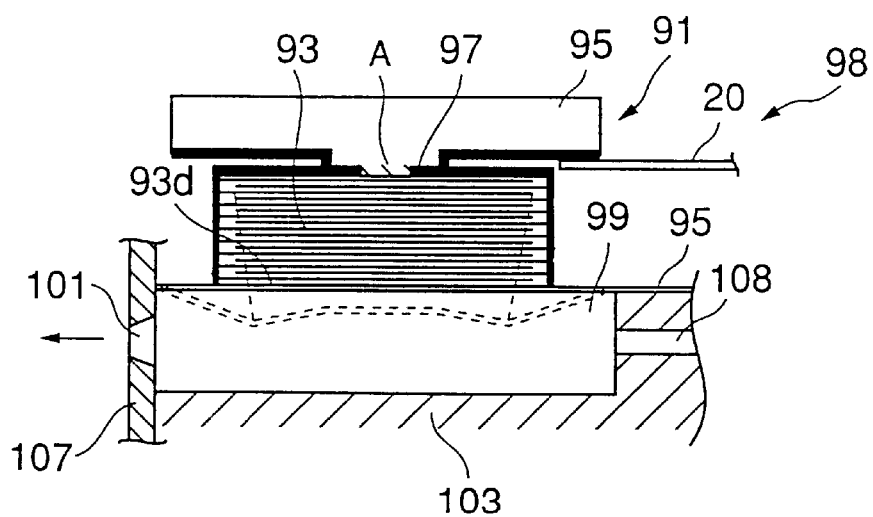
Figure 17:
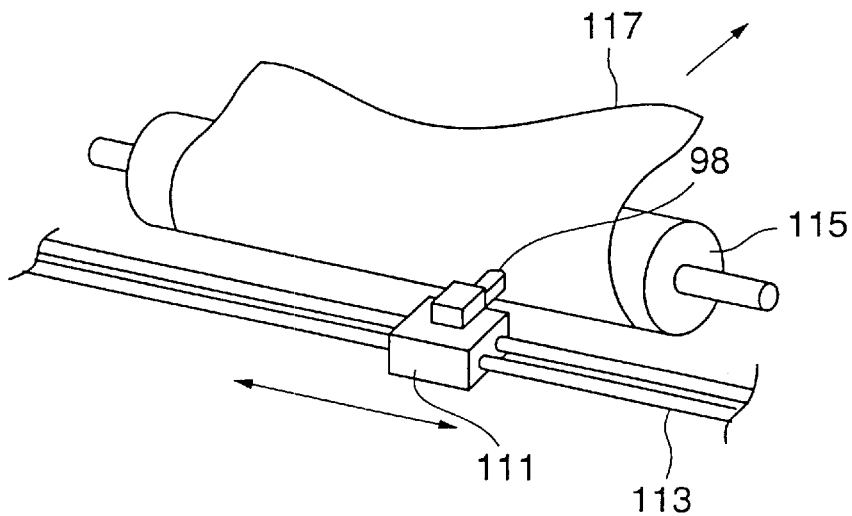
Figure 18:
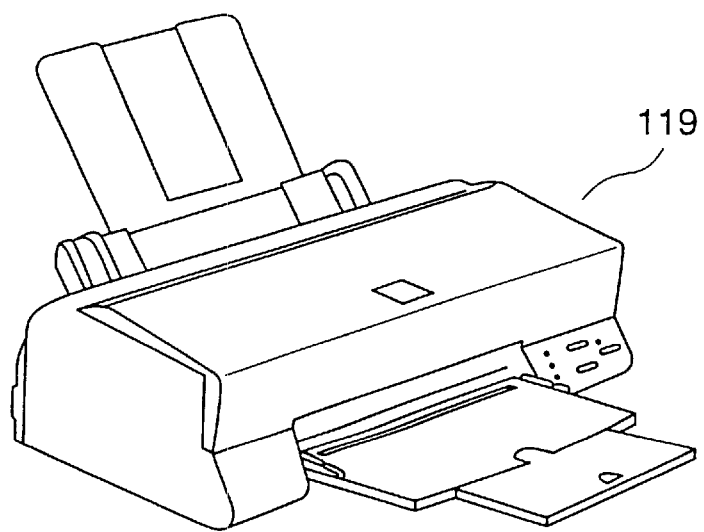
Figure 20:
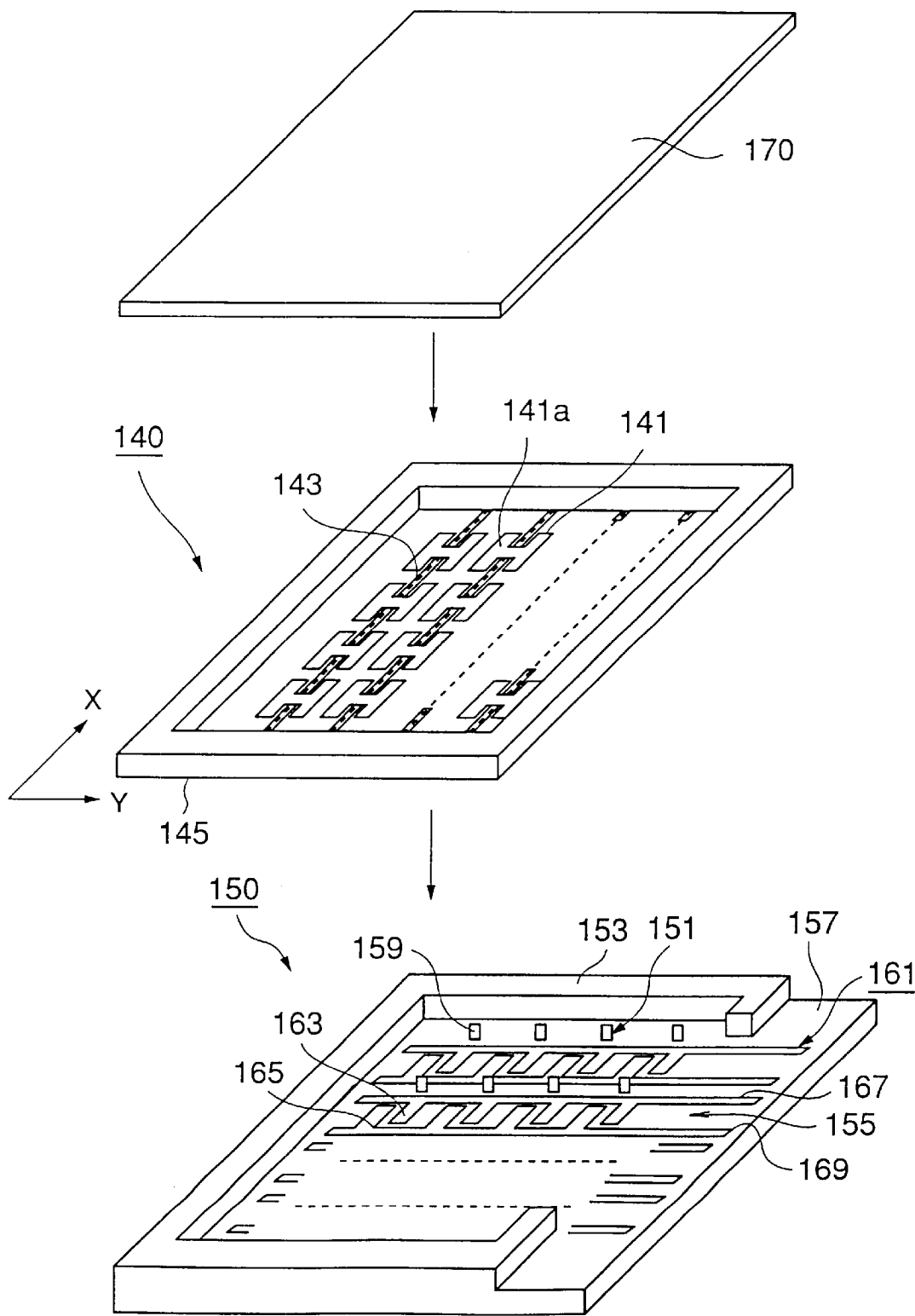
Figure 21:
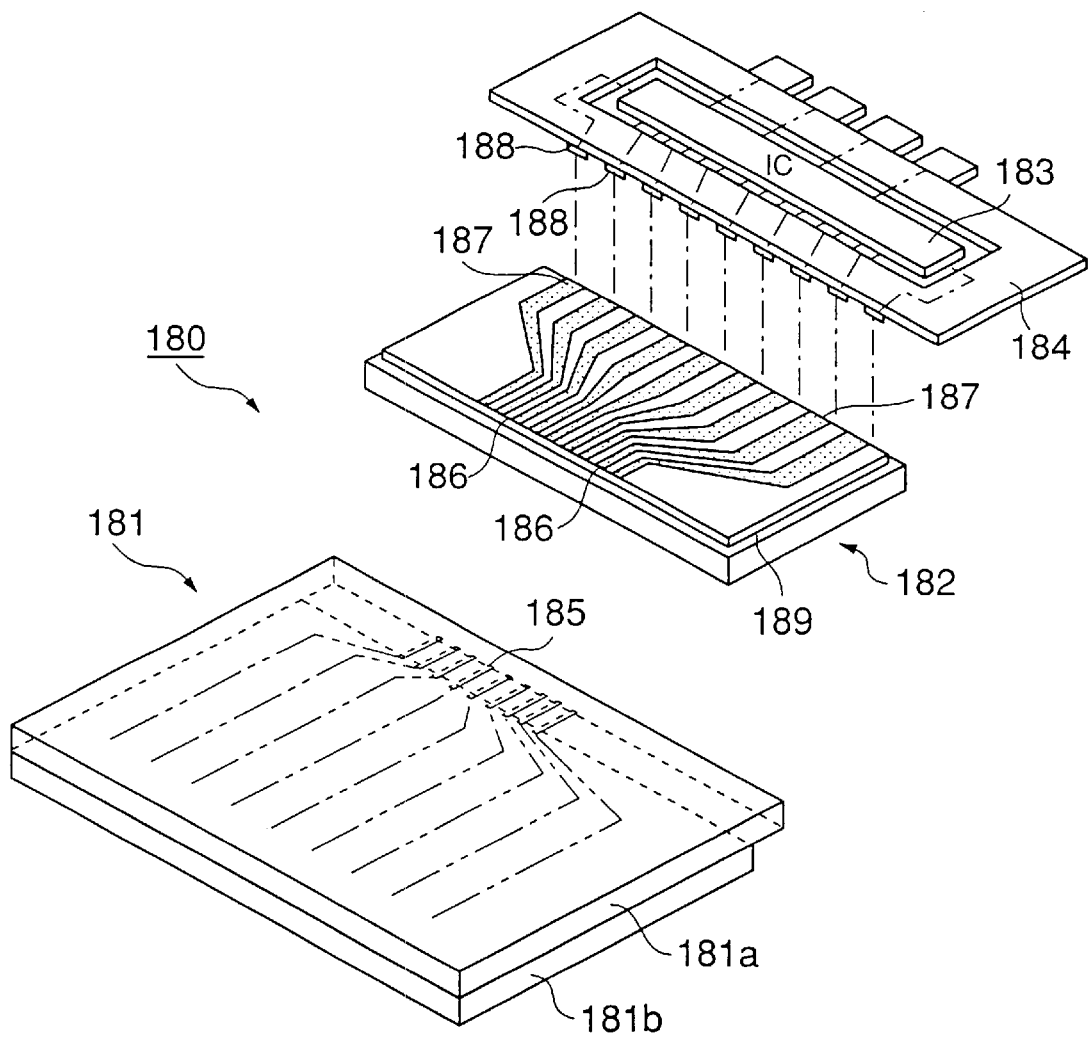
Figure 22:
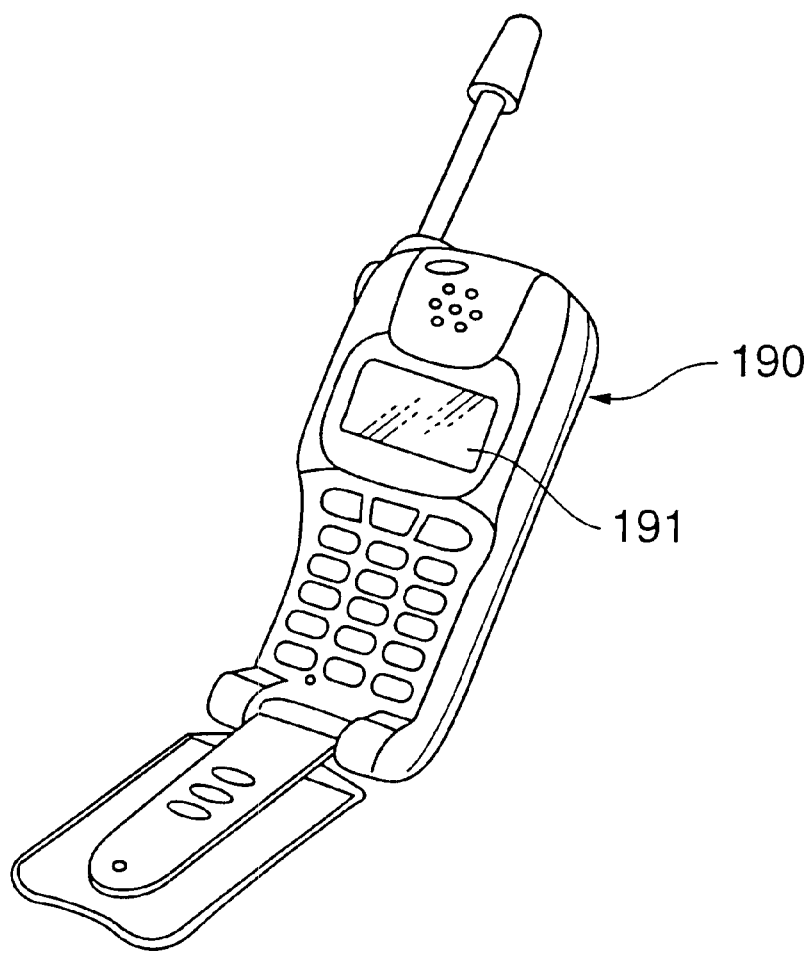
Figure 23:
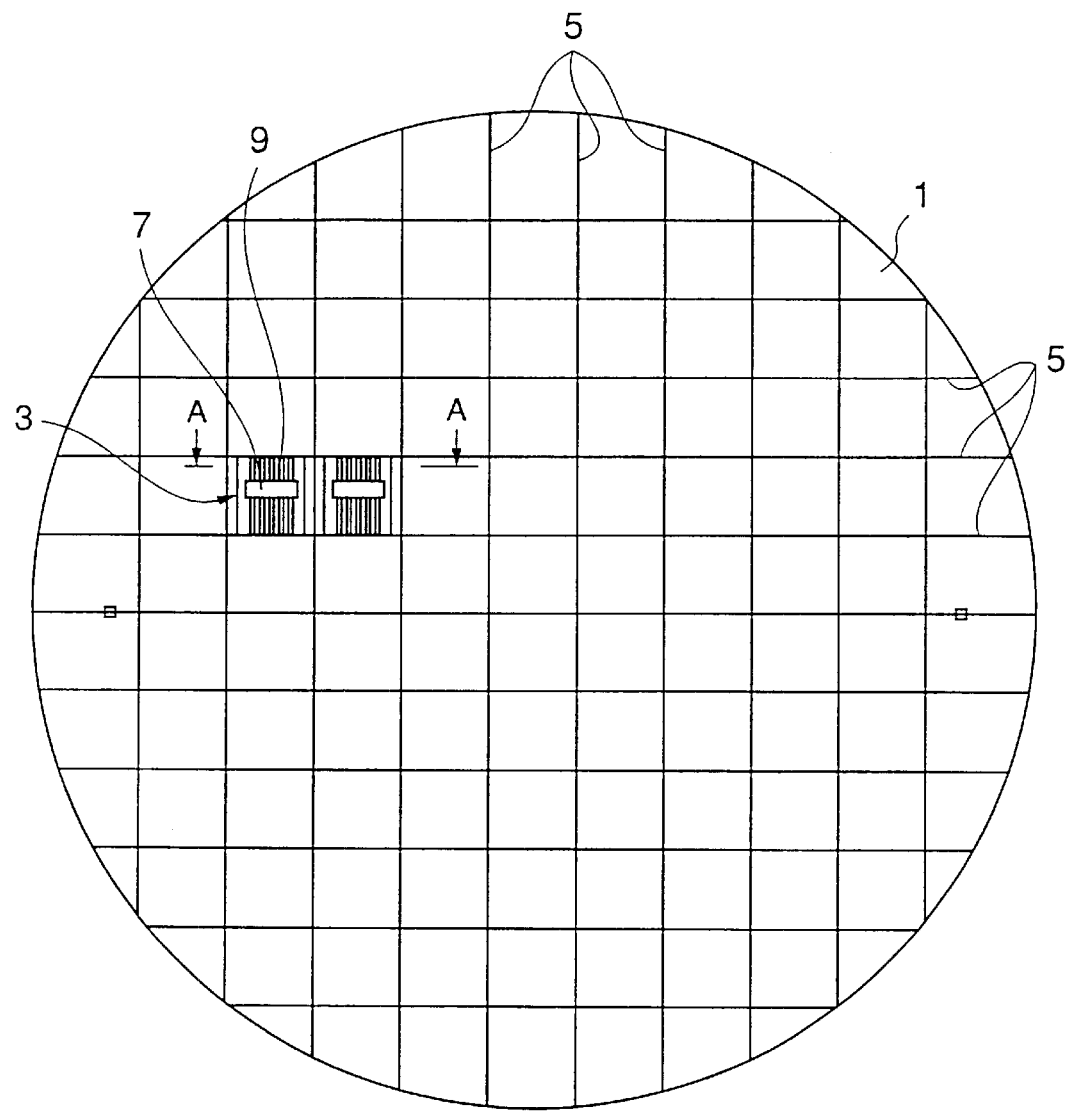
Figure 24:
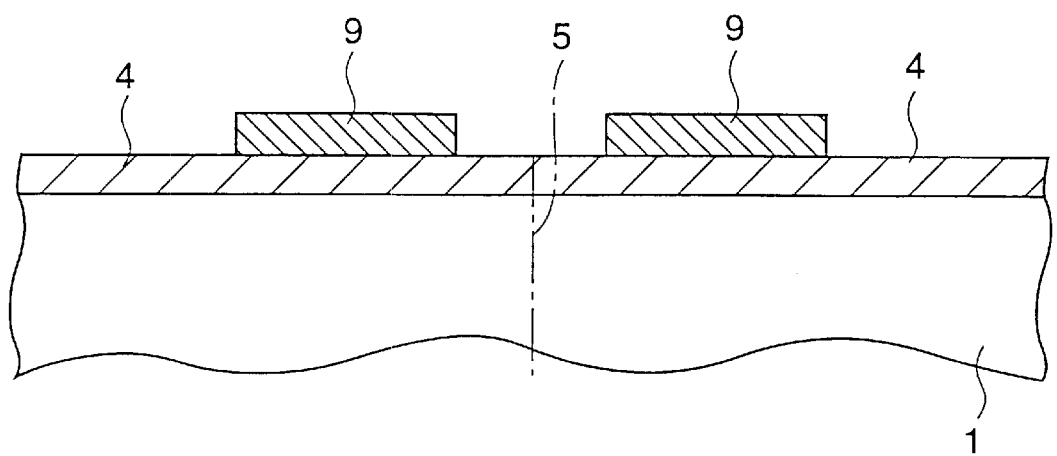
Figure 25:
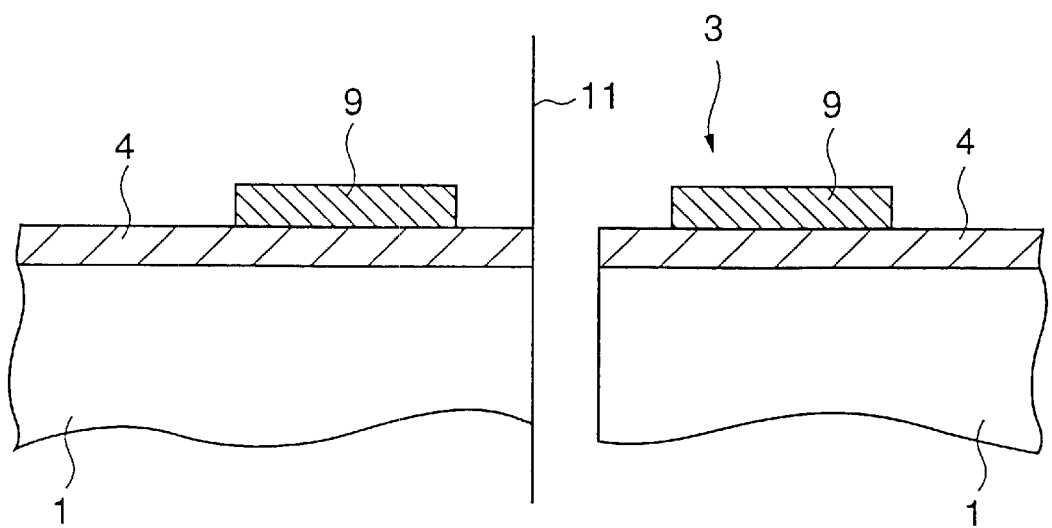
Figure 26:
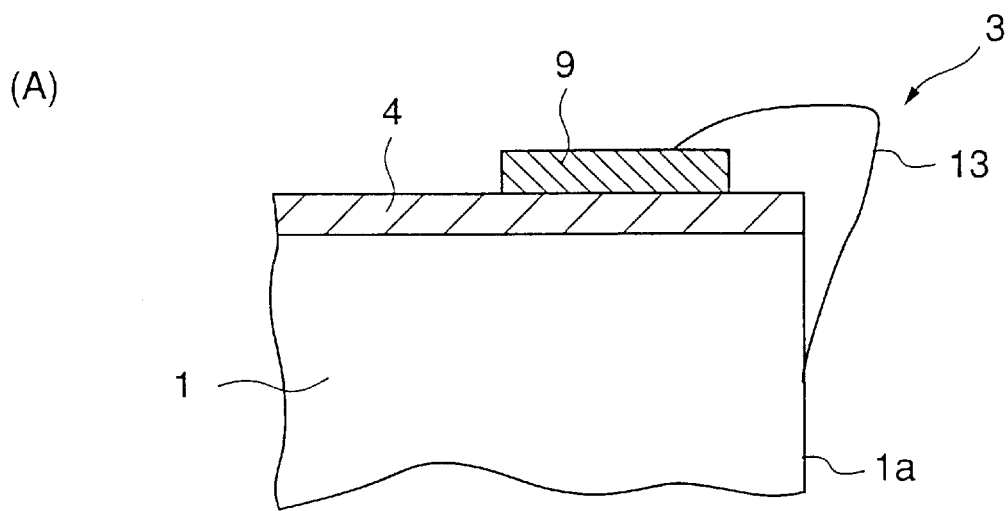
Figure 26:
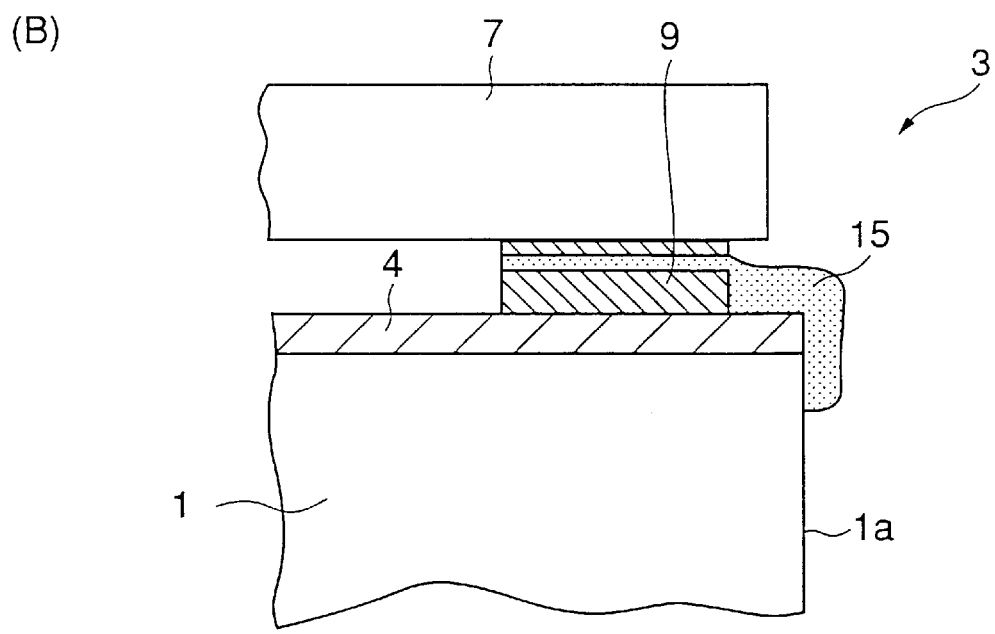

FIGS. 14(A) and 14(B) are explanatory views showing a structure of an electrostatic actuator related to a Embodiment 6 of the present invention;

FIG. 15 is an explanatory view on a piezoelectric actuator related to the present Embodiment 6;

FIG. 16 is an explanatory view on an ink jet head related to the present Embodiment 7;

FIG. 17 is an explanatory view inside an ink jet printer related to the present Embodiment 8;

FIG. 18 is an external view on the ink jet printer related to the present Embodiment 8;

FIGS. 19(A) and 19(B) are explanatory views on an example of a micromachine related to the present Embodiment 9;

FIG. 20 is an explanatory view on a photo modulation device being another example related to the present Embodiment 10;

FIG. 21 is an explanatory view on a liquid crystal panel related to the present Embodiment 11;

FIG. 22 is an explanatory view on an electronic appliance related to the present Embodiment 12;

FIG. 23 is a plan view on a silicon wafer in which conventional semiconductor devices are formed;

FIG. 24 is an enlarged sectional view along the line A—A in FIG. 23 showing its main portion;

FIG. 25 is an explanatory view on a manufacturing step of a conventional semiconductor device; and FIGS. 26(A) and 26(B) are enlarged views on a main portion of a conventional semiconductor device cut out from a silicon wafer.

BEST MODE FOR CARRYING OUT THE INVENTION

Embodiment 1

Figure 1:
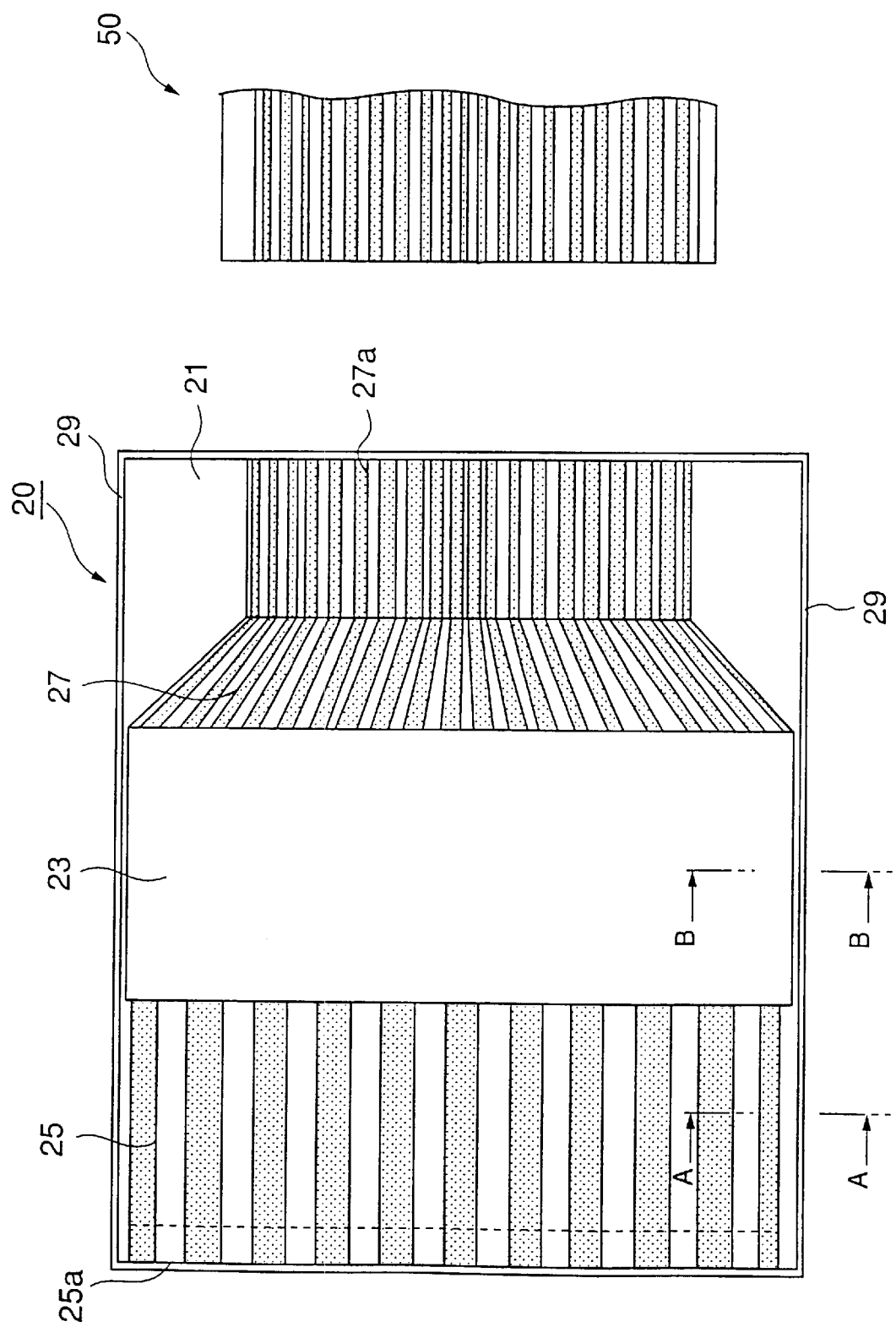

FIG. 1 is a plan view on a connector for a narrow pitch related to a Embodiment 1 of the present invention. A connector for a narrow pitch 20 comprises, as shown in FIG. 1, a substrate 21 made of single crystal silicon on which an input wiring 25 and an output wiring 27 are formed via an insulating layer, and moreover a driver IC 23 is implemented. Ends of the input wiring 25 and the output wiring 27 will be terminal electrodes 25a and 27a respectively. In addition, the input side as well as the output side is arranged to undergo conversion on the number of wiring as well as the wiring pitch.

Incidentally, the number of terminal electrodes 25a and 27a are different depending on object for connection 50 to be brought into connection with the output side. In case of an object for connection 50 being an electrostatic actuator to be mounted on a printer head, it depends on the number of units, but the input side happens to reach not less than several tens of pieces and the output side does as many as several hundreds of pieces.

At the end periphery of the substrate 21, a grooved step section 29 is formed from the front surface to the bottom surface side, and also the above described insulating layer is also formed in this step section 29.

Figure 2:
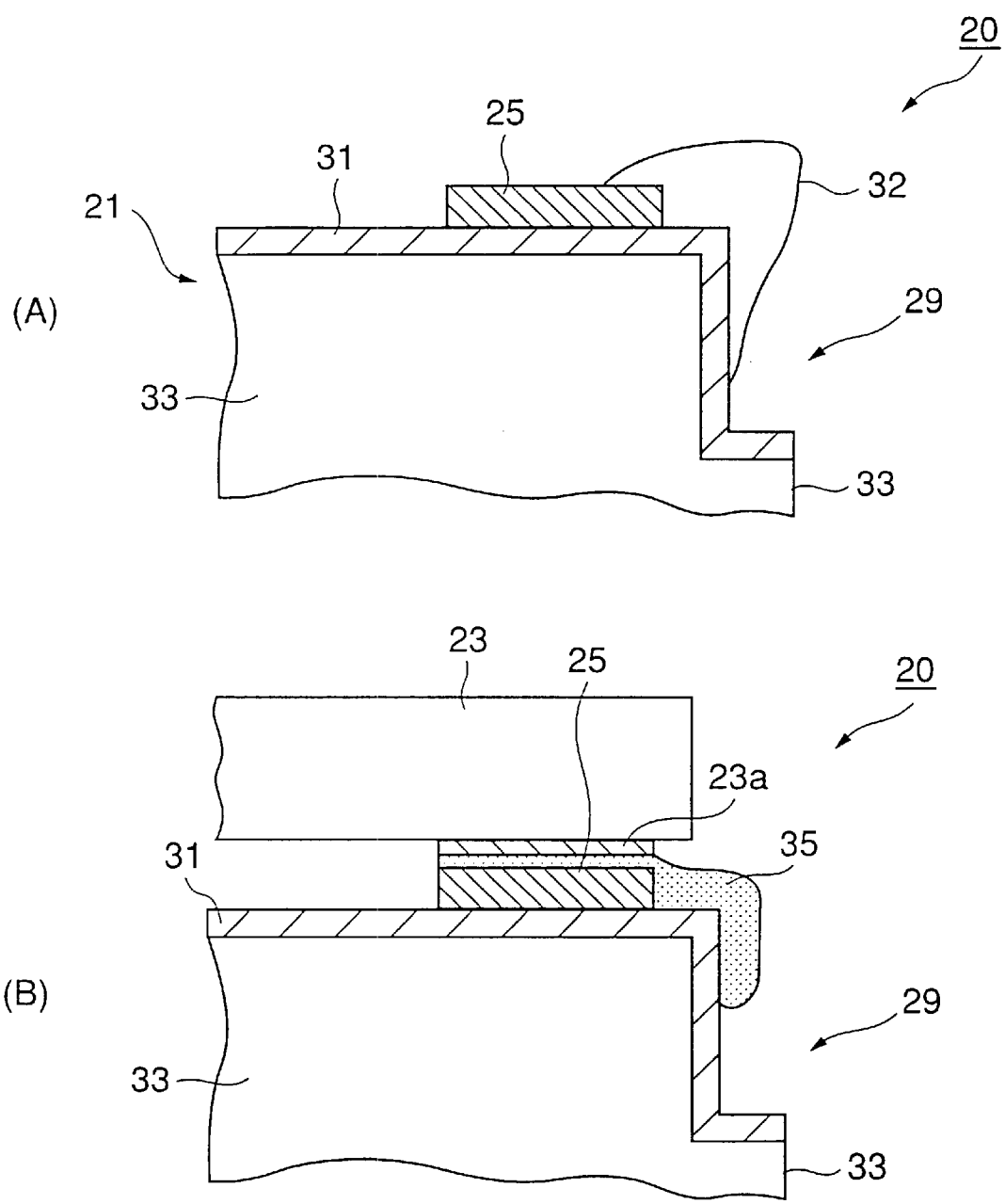

FIG. 2(A) is a sectional view along the line A—A in FIG. 1, and FIG. 2(B) is a sectional view along the line B—B in FIG. 1.

In the present embodiment, the step section 29 is formed in the end periphery of the connector for a narrow pitch 20, and the insulating layer 31 is also formed in this step section 29, and therefore, even in the case where conductive dusts in the air adhere thereto, as shown in FIG. 2(A), the dust 32 adhering to the input wiring 25 will be blocked by the insulating layer formed in the step section 29 and will not reach the crystal surface 33. Therefore, short circuit will not take place.

In addition, the soldering material or conductive adhesive to bring a driver IC 23 and the input wiring 25 into connection, which could flow out, as shown in FIG. 2(B), will be blocked by the insulating layer formed in the step section 29 and will not reach the crystal surface. Accordingly, in this case short circuit will not take place, either.

In addition, the connector for a narrow pitch 20, which employs single crystal silicon as its base material, can control coefficient of thermal expansion to a small degree, and can control elongation of the base material in the vicinity of the terminal electrode at the time of junction, and also the difference of coefficient of thermal expansion from glass which will be the base material in the printer head side is small. Therefore, at the time when both the sides are brought into junction, positional dispersion of the terminal electrodes for connection due to coefficient of thermal expansion can be controlled to minimum.

Figure 3:
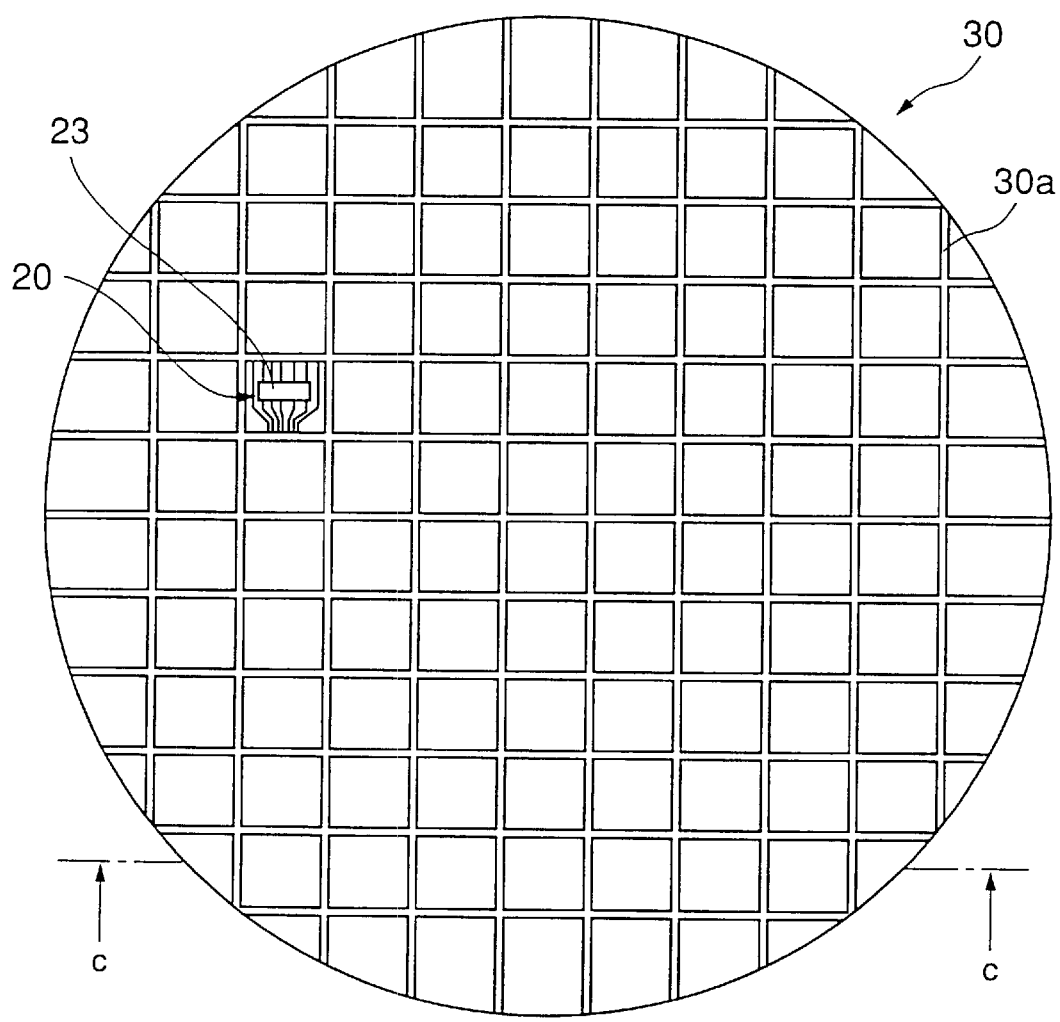
FIG. 3 is a plan view of a silicon wafer in which a number of connectors for a narrow pitch related to the Embodiment 1 of the present invention are formed.

FIG. 3 is a plan view of a silicon wafer in which a number of connectors for a narrow pitch 20 are formed. As shown in FIG. 3, a number of connectors for a narrow pitch 20 are formed in a lattice on the silicon wafer. In addition, a groove 30a is formed along a dicing line between the connectors for a narrow pitch 20 which are disposed adjacent to each other. This groove 30a undergoes dicing along its center so that a connector for a narrow pitch 20 is formed. In addition, on the surface of the groove 30a an insulating layer is formed and this groove 30a will become the step section 29 of a connector for a narrow pitch 20 by dicing.

Figure 4:
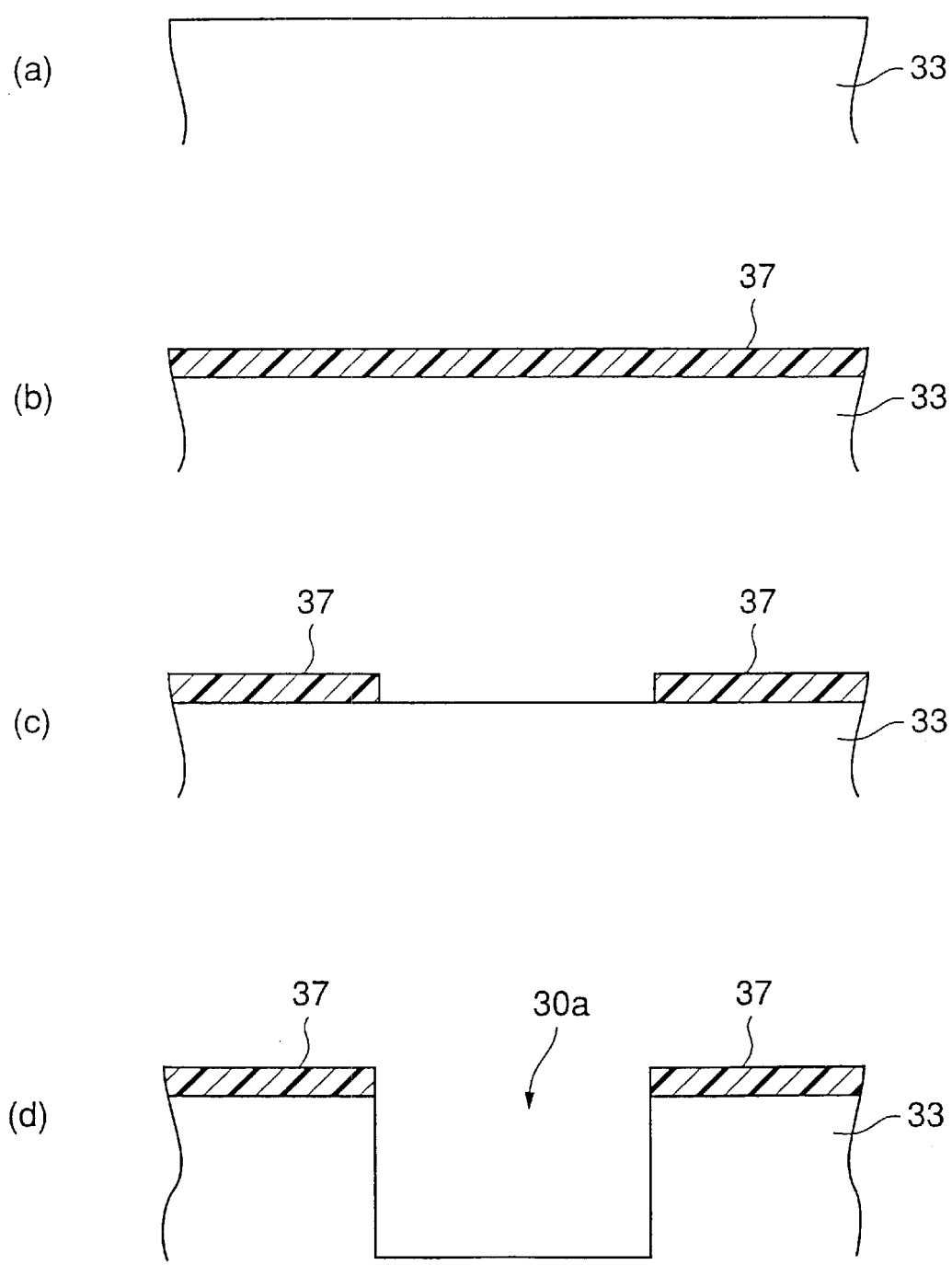
FIG. 4 is an explanatory view on a manufacturing step (Part 1) of a connector for a narrow pitch related to the Embodiment 1 of the present invention.
Figure 5:
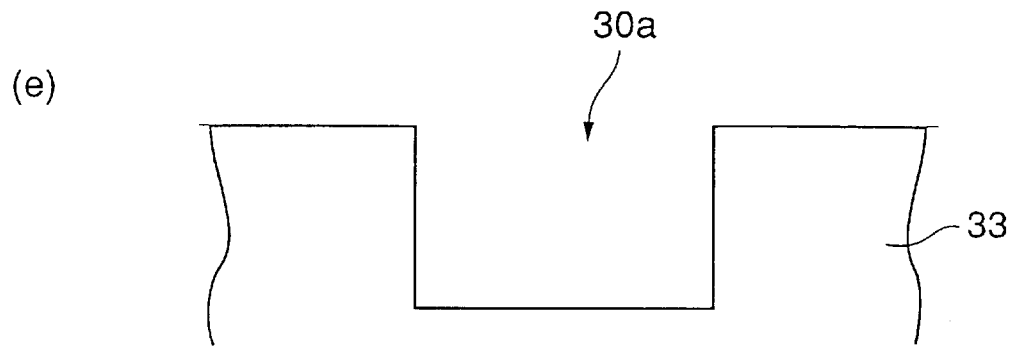
FIG. 5 is an explanatory view on a manufacturing step (Part 2) of a connector for a narrow pitch related to the Embodiment 1 of the present invention.
Figure 5:
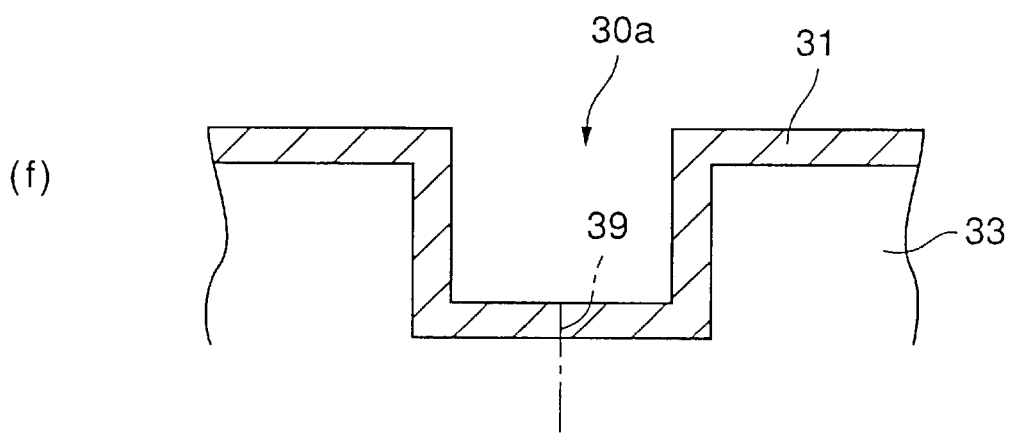
Figure 5:
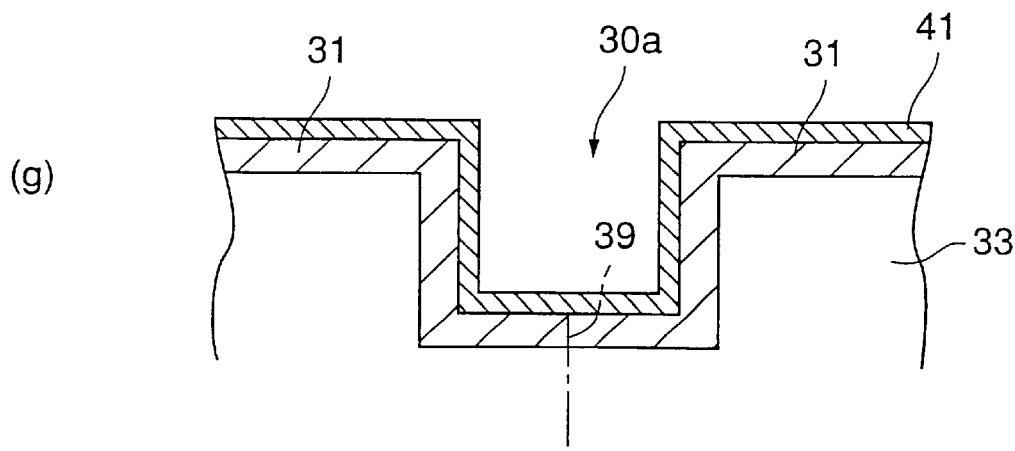
Figure 6:
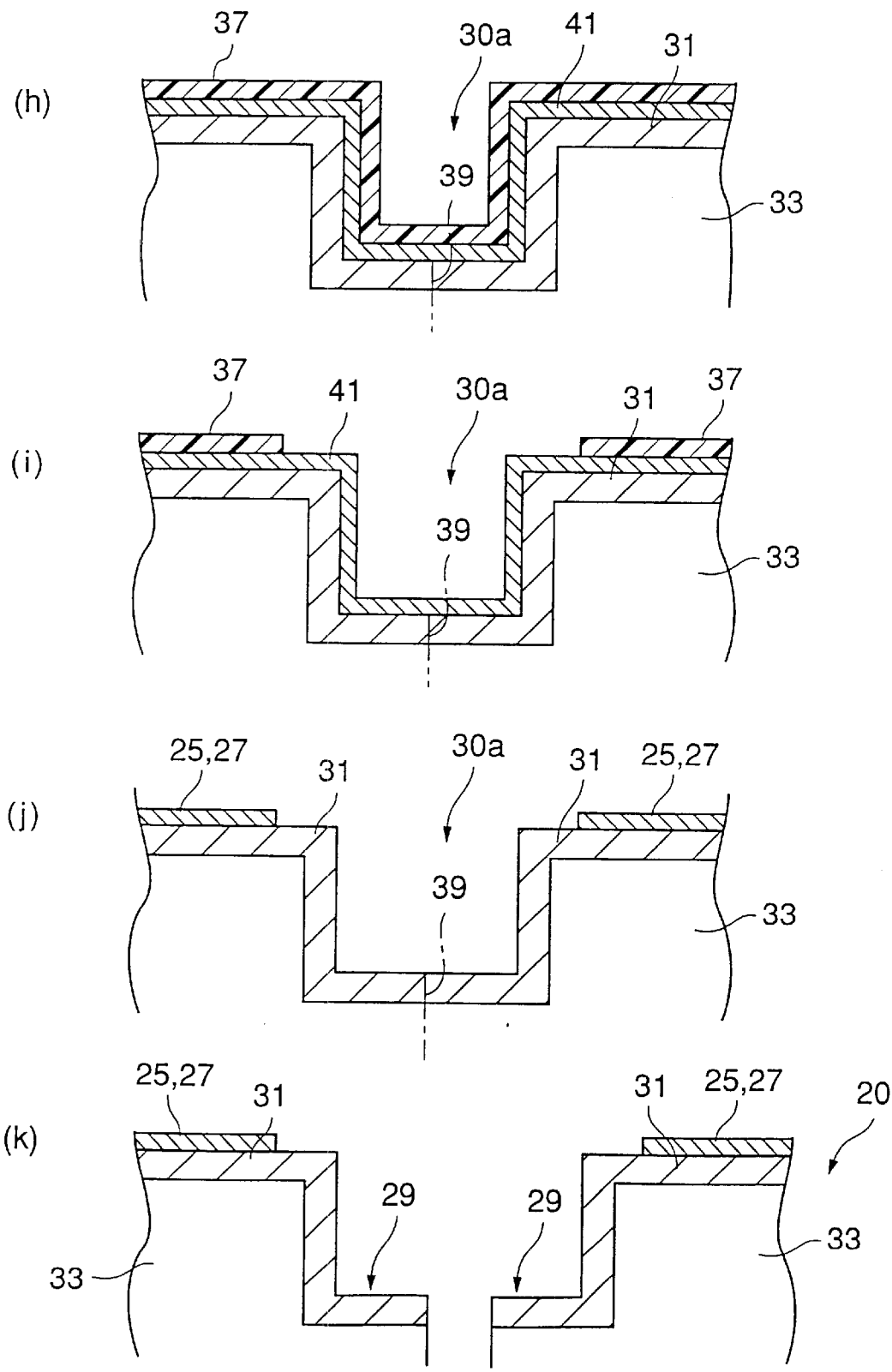
FIG. 6 is an explanatory view on a manufacturing step (Part 3) of a connector for a narrow pitch related to the Embodiment 1 of the present invention.

FIG. 4 to FIG. 6 are explanatory views on the steps to form wirings as well as grooves 30a in the silicon wafer 30, showing a portion of sectional view along the C—C line in FIG. 3.

Based on FIG. 4 to FIG. 6, forming steps of wiring and the groove 30a will be described as follows.

At first, as shown in FIG. 4(a), after the surface of the single crystal silicon wafer 33 is cleaned, a photoresist film 37 will be coated on that surface as shown in FIG. 4(b).

In addition, after the photoresist film 37 is coated, patterning is implemented by photolithography as shown in FIG. 4(c) to remove the photo resist film 37 for a part forming a groove 30a.

Thereafter, with the photoresist film 37 as a mask, the surface of the single crystal silicon wafer 33 undergoes anisotropy etching using KOH solution and etchant such as ethylenediamine solution, etc.

Incidentally, in this example, used is a single crystal silicon wafer in which crystal surface of the surface is made of (110)-plane. The (110)-plane is largely dependent on crystal orientation in the direction perpendicular (in the direction of thickness of the single crystal silicon wafer 33) to the surface of the single crystal silicon wafer 33 so that groove 30a which has rectangular sectional view with extremely little undercut can be formed regardless of the width of the groove 30a. The state in which the groove 30a is formed is shown in FIG. 4(d).

Incidentally, depth of the groove 30a may well be set in accordance with size (length) of dusts that are expected to adhere onto the surface of the connector for a narrow pitch 20 or viscosity as well as quantity of soldering material or conductive adhesive to be used for implementation of the driver IC 23.

After the groove 30a is formed, as shown in FIG. 5(e), the photoresist film 37 is removed from the surface of the single crystal silicon wafer 33, and thereafter, as shown in FIG. 5(f), an $SiO_2$ film 31 is formed on the surface of single crystal silicon wafer 33 and in the groove 30a. The $SiO_2$ film 31 should have thickness of around 5000 to 20000 angstroms, and is formed by BPSG (Boron-Phospho-Silicate Glass) which has deposited by CVD method or is formed by dry thermal oxidation or wet thermal oxidation, etc.

Thus, after the $SiO_2$ film 31 is formed on the surface of the single crystal silicon wafer 33 and in the groove 30a, the single crystal silicon wafer 33 is disposed in the argon atmosphere under 2 to 5 mTorr pressure and temperature of 150 to 300° C., and Al—Cu, Al—Si—Cu, Al—Si, Ni, Cr, Au, etc. are targeted for spattering with DC 9 to 12 kW input power, and a metal film 41 of 200 to 20000 angstroms to form the input-output wirings 25 and 27 having the same composition as in these targets is deposited. The state after formation of the metal film 41 is shown in FIG. 5(g).

Incidentally, the metal film 41 may be formed by depositing Au to have thickness of 1000 angstroms with Cr being backing.

After the metal film 41 is thus formed on the surface of $SiO_2$ film 31, as shown in FIG. 6(h), a photoresist film 37 is coated on the metal film 41. Thereafter, patterning is implemented by photolithography so that as shown in FIG. 6(i) the photoresist film other than the portions forming the input-output wirings 25 and 27 is removed. Moreover, the metal film 41 undergoes etching with the photoresist film 37 as a mask, and as shown in FIG. 6(j), the input-output wirings 25 and 27 are formed on the single crystal silicon wafer 33 so that the photoresist film on the input-output wirings 25 and 27 is removed.

In addition, dicing is implemented with a not shown cutter along the dicing line 39 set on the bottom surface of the groove 30a as shown in FIG. 6(k) so that the adjacent connector for a narrow pitch is cut off into a chip.

Incidentally, the width size of the bottom surface in the groove 30a is set larger than the thickness size of the cutter so that also when the cutter is caused to pass along the dicing line 39, the step sections 29 are formed in both the sides of the cutter.

Incidentally, in the present Embodiment 1, the grooves 30a are formed on the whole surrounding (four sides) of the connector for a narrow pitch 20, but depending on the mode of the connector for a narrow pitch 20, may be provided only in both the side peripheries in the elongated direction.

Embodiment 2

Figure 7:
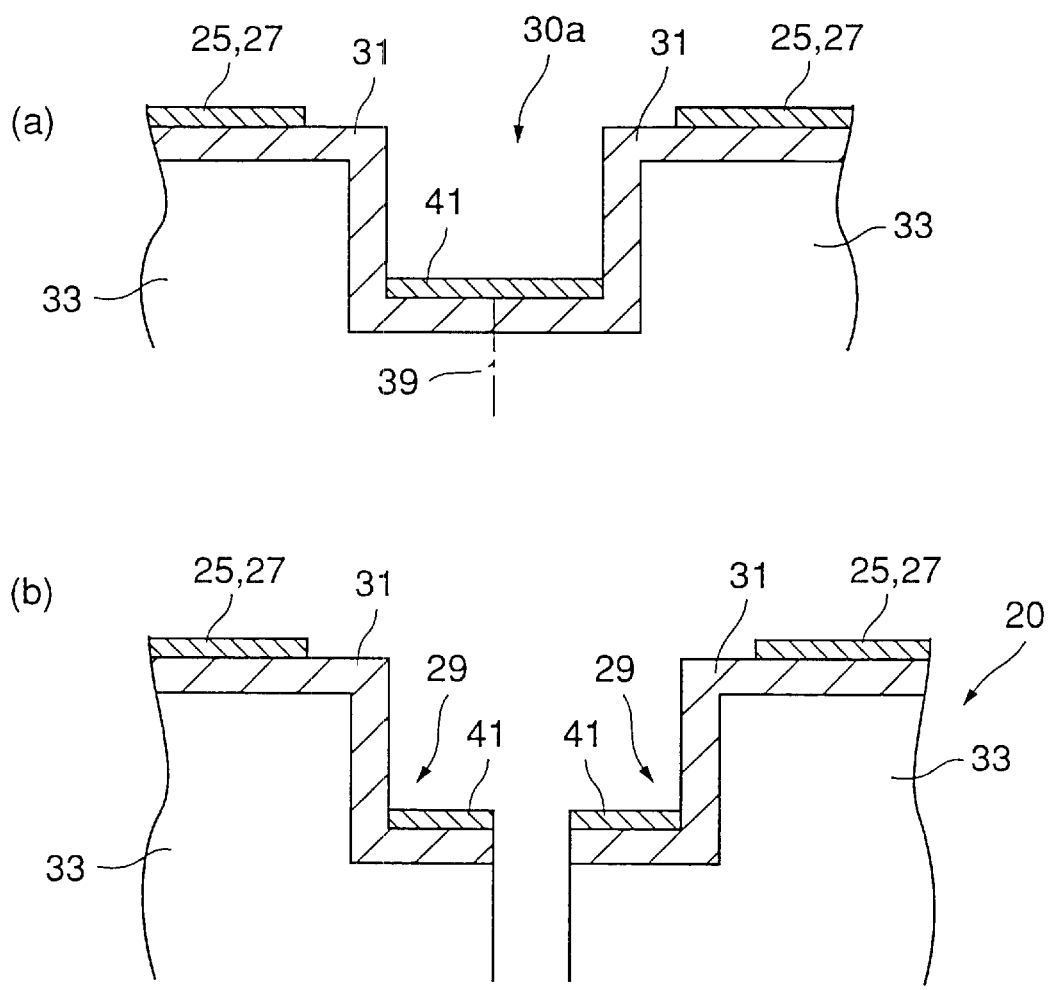
FIG. 7 is an explanatory view on a main portion of a manufacturing step of a connector for a narrow pitch related to a Embodiment 2 of the present invention.

In the above described Embodiment 1, an example in which the metal film inside the groove 30a is entirely removed has been shown. However, as shown in FIG. 7(a), the metal film 41 may be arranged to remain in the groove 30a. Thus, when the metal film 41 is left in the groove 30a, after dicing, as shown in FIG. 7(b), the metal film 41 remains in the step section 29 to encircle the connector for a narrow pitch 20.

With such an arrangement, static electricity in the air is charged in this metal film 41 so that the input-output wirings 25 and 27 of the connector for a narrow pitch 20 can be prevented from being charged. In addition, a person charged with static electricity or a metal charged with static electricity comes into contact with a semiconductor device so as to cause the static electricity to move to the metal film 41 to be charged so that the semiconductor element or the input-output wirings 25 and 27 can be prevented from being charged with static electricity.

This will serve to prevent fusing of the input-output wirings 25 and 27.

Incidentally, in order to leave the metal film 41 in the groove 30a, at the time of patterning of the photoresist film 37 shown in FIG. 6(h), the photoresist film 37 may well be arranged to be left in the groove 30a as well.

Figure 8:
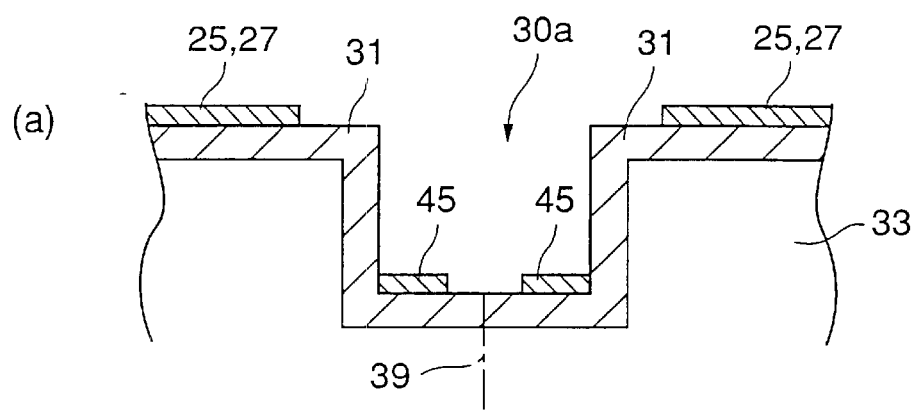
FIG. 8 is an explanatory view on a main portion of a manufacturing step of s connector for a narrow pitch related to another aspect of the Embodiment 2 of the present invention.
Figure 8:
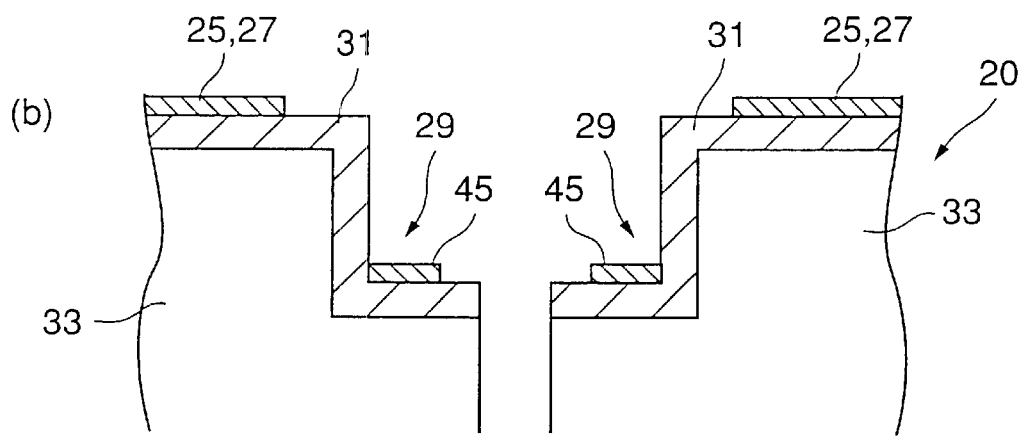

Incidentally, as shown in FIG. 8(a), the metal film 41 of the groove 30a may be formed in the portion except the dicing line of the central section of the groove 30a.

Such arrangement will make it possible to prevent a metal from adhering to a diamond blaze to be used for the blaze of a dicing machine and a metal from clogging onto the rotating thin whetstone called dicing blade, or the like and lengthen the life of the cutter compared with the case where the metal film 41 is left all over the bottom of the groove 30a.

Embodiment 3

Moreover, the metal film 41 of the groove 30a may be brought into conduction with the silicon single crystal surface 33. Such an arrangement can cause the metal film 41 of the groove 33a to be charged with static electricity and cause the static electricity to flow with the device grasping the substrate 21 being grounded in the assembly line, or with the silicon single crystal surface 33 being grounded after assembly so that static electricity can be prevented from being charged in the input-output wirings 25 and 27 of the connector for a narrow pitch 20 in a further assured manner.

Incidentally, the metal film 41 to be formed in the groove 30a is brought into conduction with the silicon single crystal surface 33 as follows.

Figure 9:
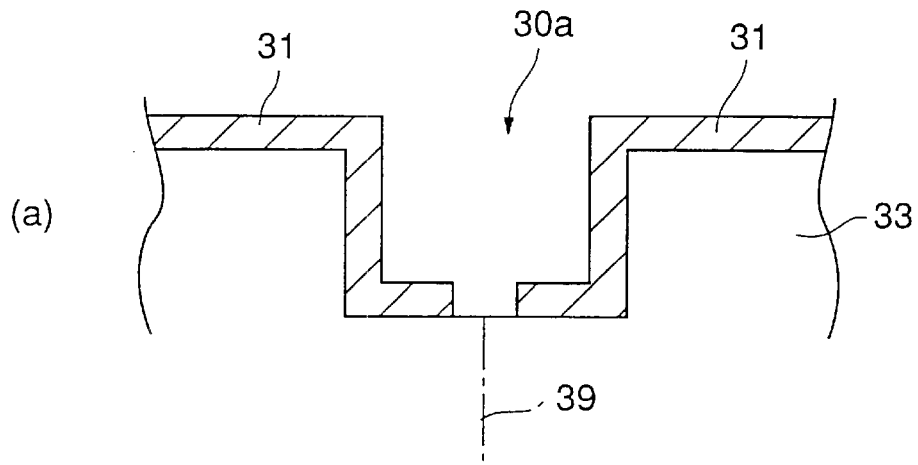
FIG. 9 is an explanatory view on a main portion of a manufacturing step of the connector for a narrow pitch related to a Embodiment 3 of the present invention.
Figure 9:
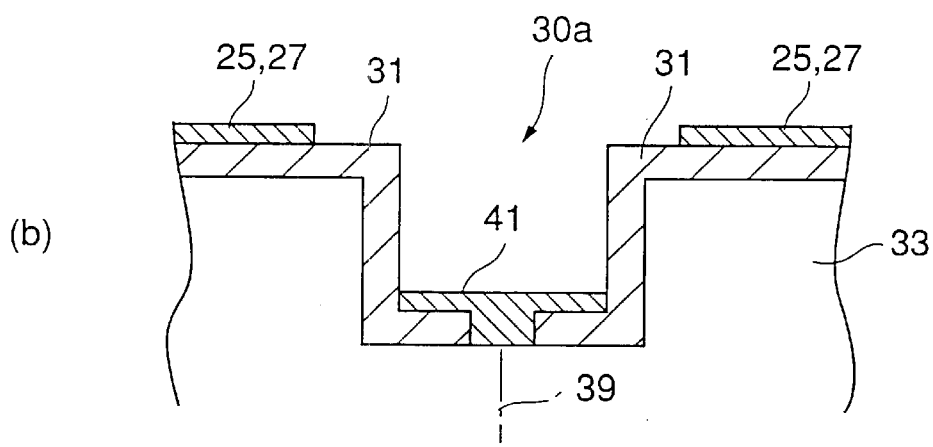
Figure 9:
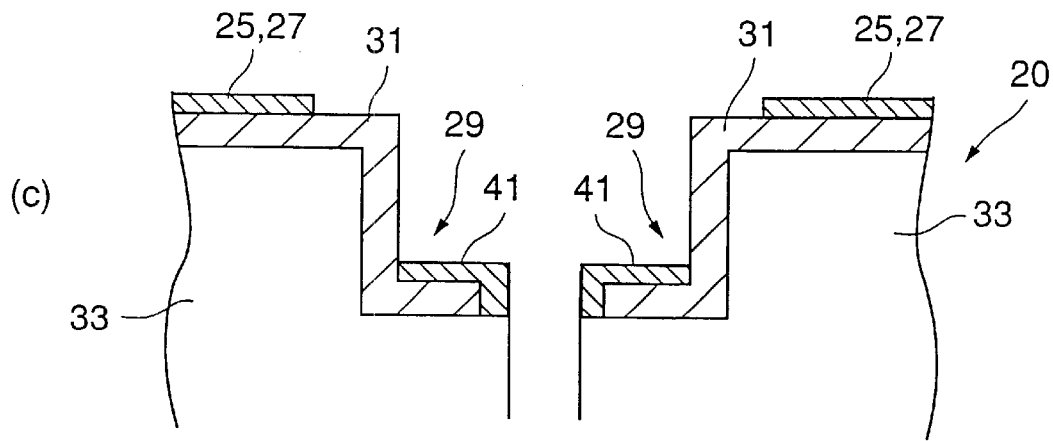

As shown in FIG. 5(f) describing the Embodiment 1, after the groove 30a is formed in the silicon wafer 30 and the insulating layer is formed, a portion of the insulating layer 31 in the bottom of the groove 30a undergoes etching with fluorine for removal as shown in FIG. 9(a). Under this state, a metal film for input-output wirings is deposited. In addition, the resist film is coated for patterning and etching, as shown in FIG. 9(b), the metal film 41 is left on the bottom of the groove, and the metal film 41 and the silicon single crystal surface 33 can be brought into conduction.

Embodiment 4

Figure 10:
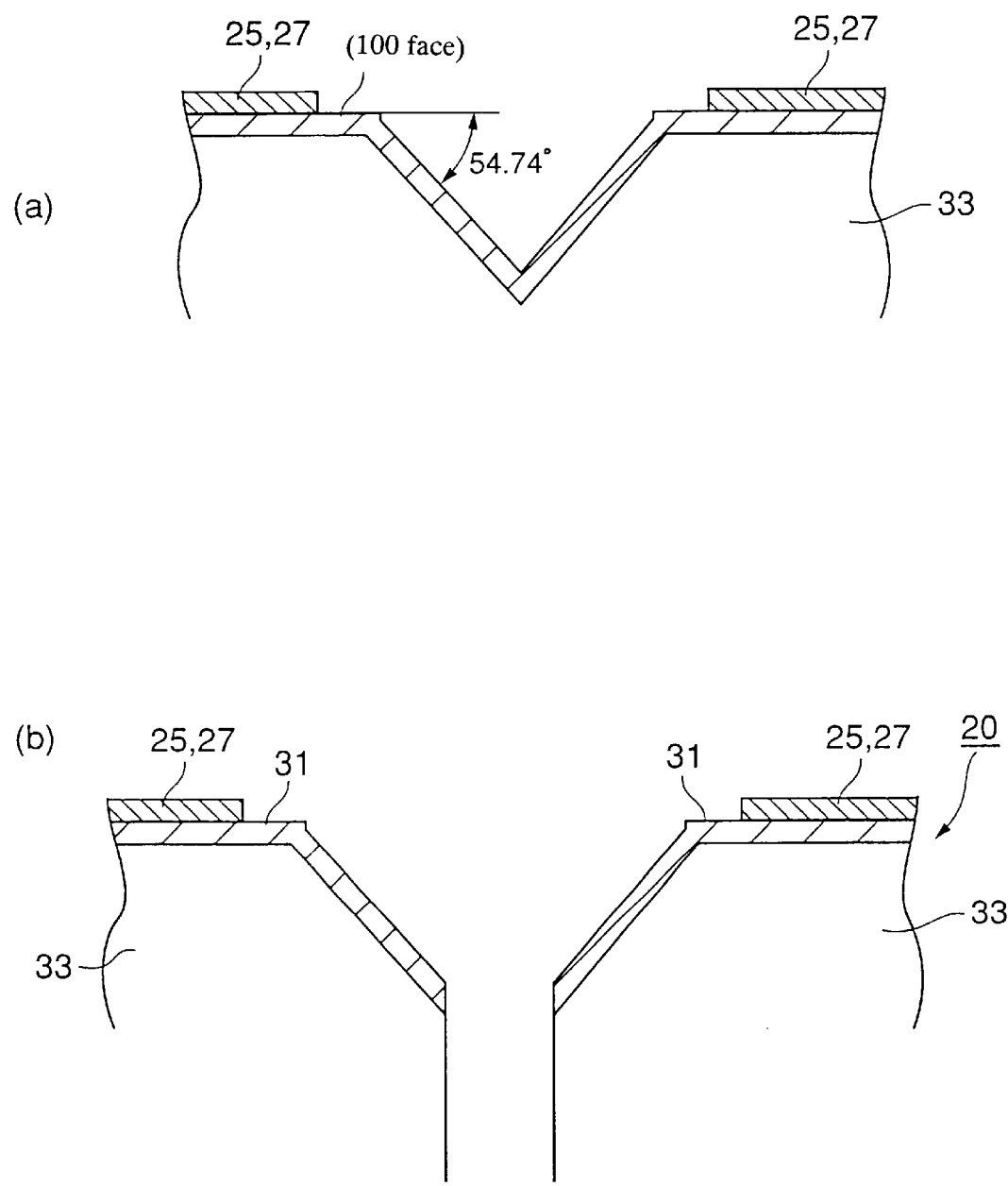
FIG. 10 is an explanatory view on a main portion of a manufacturing step of the connector for a narrow pitch related to a Embodiment 4 of the present invention.

In the above described example, the groove 33a is shown to be rectangular in the sectional view, but as shown in FIG. 10(a), the sectional view of the groove 33a may be arranged to appear like the letter V. Such an arrangement will cause an inclined insulating layer 30 to be formed surrounding the connector for a narrow pitch 20 as shown in FIG. 10(b) at the time when the connector for a narrow pitch 20 is cut out into a chip, and thus dusts or dirt which are given rise to at the time of dicing can be easily removable.

Incidentally, in order to form a V-groove, those having (100)-plane being the crystal surface to be exposed on the surface in the silicon wafer may be adequately used.

The above described Embodiments 1 to 4 show the connector for a narrow pitch 20 in which the driver IC 23 is implemented exemplifying a semiconductor device. However, the present invention will not be limited hereto, but can be widely applied to other semiconductor devices, such as micromachines such as electrostatic actuators, piezoelectric actuators, etc., and liquid crystal panels, etc.

Embodiment 5

Figure 11:
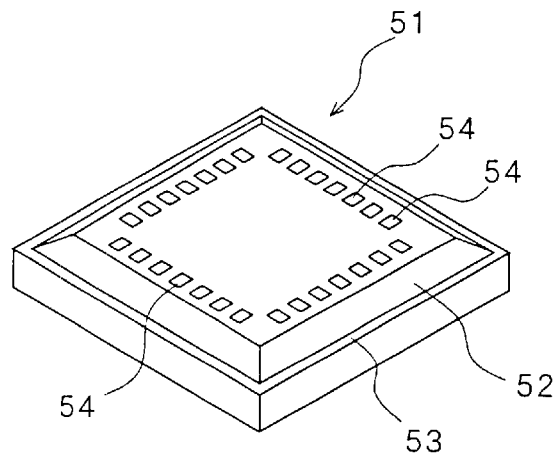
FIG. 11 is a perspective view on a semiconductor device (IC chip) related to a Embodiment 5 of the present invention.

FIG. 11 is a perspective view of another embodiment of the present invention. In the present embodiment, an inclined surface 52 as well as a step section 53 is formed around the outer periphery surface of an IC chip 51, and an insulating layer is formed on these inclined surface 52 and step section 53.

Thus, with the insulating layer being formed around the outer periphery surface of the IC chip 51, an edge short circuit at the time of connection between the terminal electrode 54 of the IC chip 51 and the outside terminal can be prevented.

Figure 12:
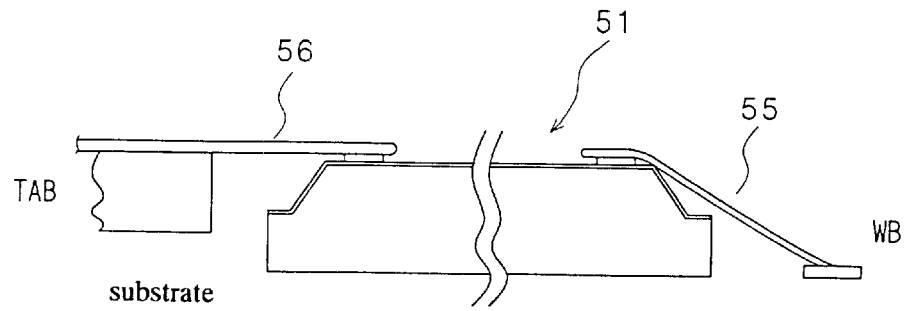
FIG. 12 is an explanatory view on a performance of the Embodiment 5 of the present invention.

That is, as shown in FIG. 12, at the time of connection between a terminal electrode 54 and a wire 55 by way of wire bonding or a lead 56 by way of tape carrier package, an insulating layer is formed so that the wire 55 or the lead 56 is unlikely brought into contact with the crystal surface and thus no edge short circuit takes place.

Figure 13:
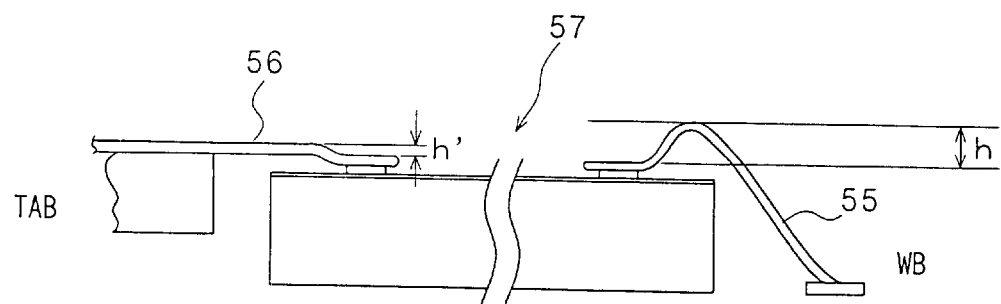
FIG. 13 is an explanatory view on a conventional embodiment compared with the Embodiment 5 of the present invention.

In this regard, in a conventional IC chip 57 shown in FIG. 13, the wire 55 or the lead 56 takes the risk of edge short circuit at the time of connection, and in order to avoid this, the wire 55 or the lead 56 should be deformed so as to float upward with the distance of h or h'. Therefore, the IC chip 57 is thick.

On the other hand, according to the present embodiment, such deformation will become unnecessary so that the IC chip 51 can be made thin.

Incidentally, for the connection of electrodes in the tape carrier package (TAB), metal connection such as Au—Au connection and Au—Sn connection, etc., is used, and for the wire 55 used for wire bonding, a metal wire made of Au or Al, etc., is used. For the shown wire 55, wedge bonding using aluminum wire is shown.

Embodiment 6

Figure 14:
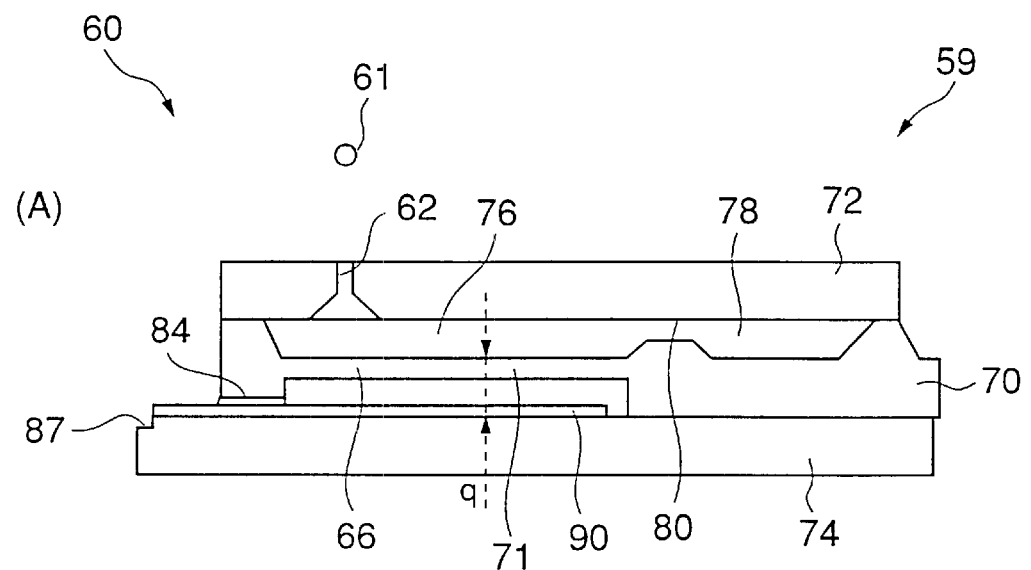
Figure 14:
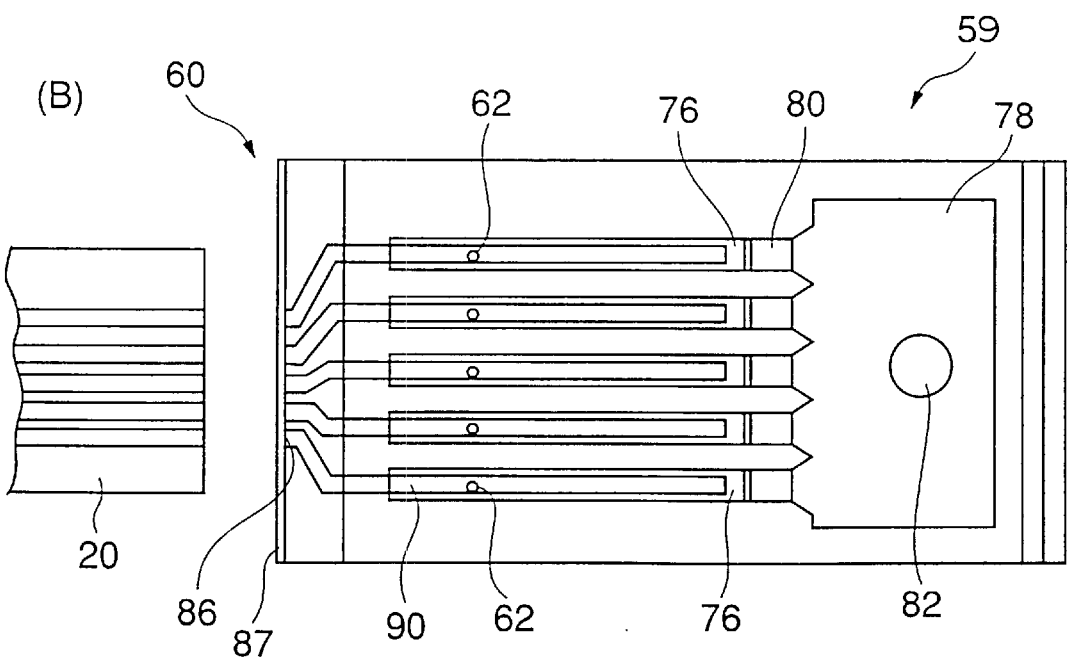

FIG. 14 is an explanatory view showing configuration of an electrostatic actuator 59 related to the Embodiment 6 of the present invention.

FIG. 14 shows an electrostatic actuator 59, which is used for an ink jet head in an ink jet printer, is an actuator in a micro-structure formed by micro-processing by micro-machining technology.

As the ink jet head of the present Embodiment 6, a plurality of ink jet heads are manufactured under a state of wafer. Then, the ink jet head is cut along the dicing line to manufacture an ink jet head main body 60 together with a connector section to implement outside wirings with this to be produced individually, and these are brought into connection. Incidentally, the connector section is similar to the connector for a narrow pitch 20 shown in the Embodiments 1 to 4.

The ink jet head main body 60, as shown in FIG. 14, has three-layer structure with silicon substrate 70 sandwiched in-between, a nozzle plate 72 likewise made of silicon for the upper side, and a glass substrate 74 made of borosilicate glass for the lower side being laminated respectively.

Here, the central silicon substrate 70 is provided with independent five ink chambers 76, a common ink chamber 78 connecting these five ink chambers 76, and grooves to function as ink supply routes 80 to link to this common ink chamber 78 and respective ink chambers 76.

In addition, these grooves are closed with the nozzle plate 72 so that the respective portions are formed into divisions to constitute the ink chamber 76 or the supply route 80.

In addition, the back side of the silicon substrate 70 is provided with five independent concave portions corresponding with the ink chambers 76 respectively and these concave portions are closed with the glass substrate 74 so that an oscillation chamber 71 having height of the size q in FIG. 22 is formed. In addition, the partition between each ink chamber 76 and the oscillation chamber 71 in the silicon substrate 70 will be an oscillation plate 66 to become an oscillator which can undergo elastic deformation.

In the nozzle plate 72, nozzles 62 are formed in positions corresponding to the tips of respective ink chambers 76 so as to link to respective ink chambers 76.

Incidentally, the grooves to be provided in the silicon substrate 70 and the nozzles 62 to be provided in the nozzle plates 72 are formed using micro-processing technology by micro-machining technology.

On the glass substrate 74 as well as the oscillation plate 66, facing electrodes 90 to respectively face are disposed.

Incidentally, micro-gaps formed between the silicon substrate 70 and the facing electrodes 90 are sealed by the sealing section 84.

In addition, the facing electrodes 90 on the respective glass substrate 74 are drawn out to the left end side in the drawing so as to form a terminal electrode 86. At the end of the substrate in which this terminal electrode 86 is formed, as shown in the Embodiment 1, a step section 87 having insulating layer is formed.

In addition, the connector for a narrow pitch 20 to be separately produced is brought into connection with the terminal electrode 86 to become an ink jet head having a connector section.

Operation of an ink jet head main body 60 configured as described above will be described.

The common ink chamber 78 is supplied with ink from a not shown ink tank through the ink supply orifice 82. In addition, the ink supplied to the common ink chamber 78 is supplied to each of the ink chambers 76 through the ink supply route 80. Under this state, when a voltage is applied to the facing electrodes, electrostatic force generated between them causes the oscillation plate 66 to undergo electrostatic absorption toward the side of the glass substrate 74 and to oscillate. Oscillation of this oscillation plate 66 gives rise to dispersion in inner pressure inside the ink chamber 76 so that the ink drops 61 are split out from the nozzle 62.

In the present embodiment, the ink jet head main body 60 and the connection section in the connector for a narrow pitch 20 are provided with a step section having insulating layer so as to give rise to effects as follows.

That is, at the time of connection between the ink jet head main body 60 and the connector for a narrow pitch 20, the soldering material or the conductive adhesive to be used for junction between the second substrate and the object for connection or the outside substrate, which could flow out, will be blocked by the insulating layer and will not reach the conductive silicon substrate surface. Therefore, no short circuit (edge short circuit) will take place.

In addition, a conductive dust, which happens to be attached in the ink jet head main body 60 and the terminal electrode section of the connector for a narrow pitch 20, will be blocked by the insulating layer formed in the outer periphery surface and will not reach the conductive silicon substrate surface. Accordingly, also in this case no short circuit (edge short circuit) will take place.

Embodiment 7

FIG. 15 is an explanatory view on a piezoelectric actuator of the present embodiment.

The piezoelectric actuator 91 comprises a piezoelectric oscillator 93 in both sides of which outside electrodes 93a and 93b are formed and a holding member 95 to hold this piezoelectric oscillator 93. In the holding member 95, in which a protrusion 97 is formed, and the piezoelectric oscillator 93 is brought into junction with the holding member 95 in the junction region A of the protrusion 97. The outside electrodes 93a and 93b (shown by bold lines in the drawing) of the piezoelectric oscillator 93 are respectively extended to the middle of the first surface 93C from both the sides of the piezoelectric oscillator 93.

In addition, the electrodes 95a and 95b shown with bold line to be formed in the holding members 95 are also extended to the middle of the protrusion 97 from the both external peripheries. In addition, the piezoelectric oscillator 93 and the holding member 95 are brought into junction like a rigid body in the junction region A set in the protrusion 97, and the outside electrodes 93a and 93b of the piezoelectric oscillator 93 are brought into connection with the electrodes 95a and 95b of the holding member so that these are brought into conduction.

Moreover, the electrodes 95a and 95b of the holding member 95 are brought into connection with the connector for a narrow pitch 20 shown in the Embodiment 1, and signals from outside are inputted into the piezoelectric actuator 91 via the connector for a narrow pitch 20.

Thus, also in this Embodiment 6, the connector for a narrow pitch 20 is used so that short circuit (edge short circuit) at the time of junction between the connector for a narrow pitch 20 and the electrode 95a and 95b of the holding member 95 can be prevented.

Incidentally, if a step section having an insulating layer in the junction section at the connector for a narrow pitch 20 in the holding member 95 is provided, short circuit (edge short circuit) at the time of junction can be prevented in a further assured manner.

Embodiment 8

FIG. 16 is a conceptual view showing the ink jet head 98 using the piezoelectric actuator 91 shown in FIG. 15. The nozzle plate 108, in which the nozzle 101 is disposed, is brought into contact with the tip of the ink flow route 99 formed by the flow route forming member 103 and the oscillation plate 105, and in the opposite end thereof, the ink supply route 108 is disposed. In addition, the piezoelectric actuator 91 is installed so as to bring the mechanical operation surface 93d and the oscillation plate 95 into contact, and is disposed so as to face the ink flow route 99. In addition, the outer electrodes 93a and 93b at both the ends of the piezoelectric oscillator 93 are brought into connection with electrodes 95a and 95b of the holding member, and the electrodes 95a and 95b of the holding member 95 are brought into connection with the connector for a narrow pitch 20 so that the signals from outside is inputted to the piezoelectric actuator 91.

In this configuration, the ink is filled inside the ink flow route 99 (up to the tip of the nozzle 101), and the above described piezoelectric actuator 91 is operated, then the mechanical operation surface 93d gives rise to a highly efficient expansion deformation and bending deformation at the same time so that an extremely large effective displacement in the upward-downward direction in FIG. 16 is obtained. This deformation serves to cause the oscillation plate 95 to undergo deformation corresponding with the mechanical operation surface 93d as shown in the dotted line in the drawing so as to give rise to a large pressure change (voluminal change) inside the ink flow route 99. This pressure change causes the ink drops to be spilt out from the nozzle 101 in the direction of the arrow in the drawing, and its highly efficient pressure change makes ink spilling very efficient.

Using the connector for a narrow pitch 20 with an insulating layer having been formed on the outer periphery surface can prevent short circuit as described in the Embodiment 7, and therefore reliability of the ink jet head 98 of its own can be improved.

Embodiment 9

Incidentally, the ink jet head 98 related to the above described Embodiment 7 is attached to the carriage 111 as shown in FIG. 17. The carriage 111 is attached to the guide rail 113 in a freely movable manner and its position is controlled in the direction of width of the paper 117 to be forwarded by the roller 115. The mechanism of this FIG. 17 is equipped in the ink jet printer 119 shown in FIG. 18. Incidentally, this ink jet head 98 can be installed as a line head of a line printer. In that case, the carriage 111 will become no longer necessary.

In addition, herein an ink jet head 98 of a type in which a piezoelectric actuator 91 is used and ink drops are spilt out in the edge direction as well as an ink jet printer using it has been exemplified for description, but the case where an ink jet head 60 of a type in which the ink drops are spilt out from the both sides of the face using the electrostatic actuator shown in the above described Embodiment 7 will be configured likewise.

Embodiment 10

Figure 19:
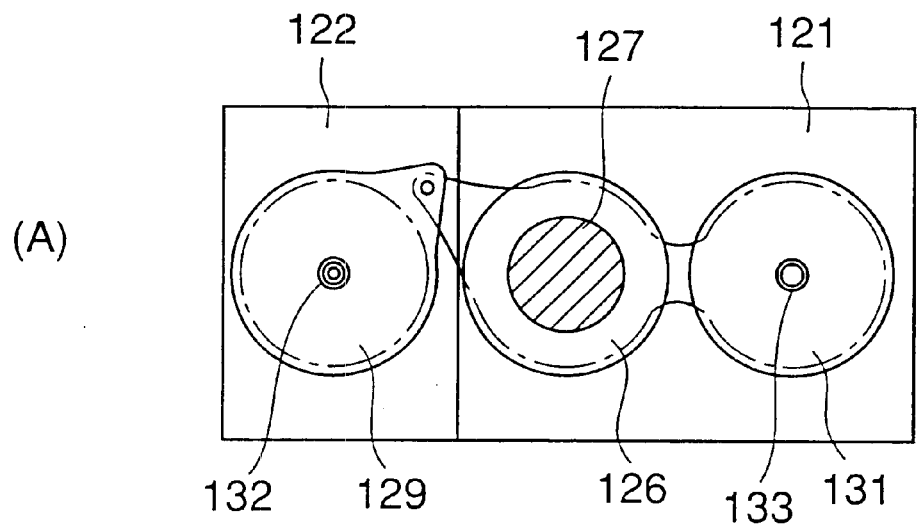
Figure 19:
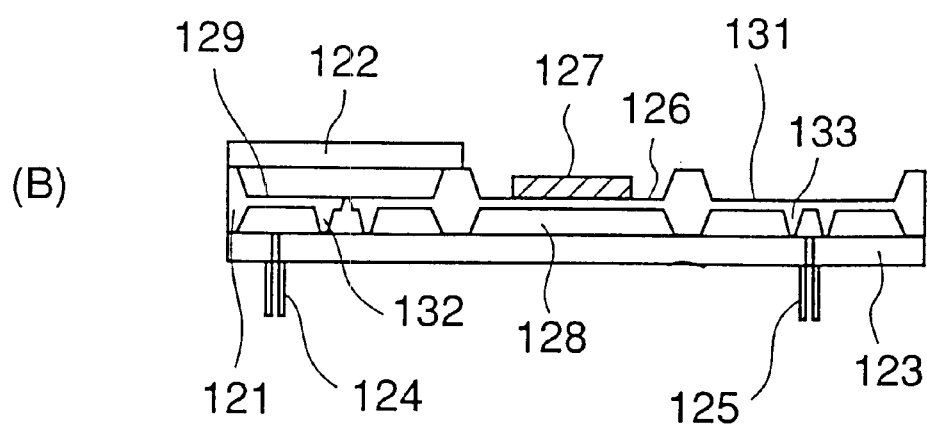

FIG. 19 relates to a micro-pump as an example of the micromachine related to the present embodiment, and FIG. 19(A) shows a top view of the micro-pump and FIG. 19(B) shows a sectional view thereof.

The micro-pump is configured by comprising a silicon substrate 121 subject to processing by the micro-machining processing method being sandwiched by two glass plates 122 and 123, and is to absorb the fluid with the pipe 124 at the absorbation side and to spill out the fluid to the pipe 125 at the spill out side.

The principle of its operation is to apply voltages to the piezoelectric element 127 stuck to the diaphragm 126 formed in the central section of the silicon substrate 121 so that it is caused to bend to change the pressure inside the pressure chamber 128 so as to cause displacement in the valve film 129 of the absorption side as well as the valve film 131 of the spill out side which are disposed in series in space with the above described pressure chamber 128 to open/close the absorption valve 132 as well as the spill out valve 133 to press-deliver the fluid from the pipe 124 of the absorption side to the pipe 125 of the spill out side. Incidentally, in FIG. 19(B), the space above the pressure chamber 128 and the valve film 129 of the absorption side and the space below the valve film 131 of the spill out side are disposed in series.

This example, as in the above described Embodiment 6 or 7, also undergoes wiring with outside elements via the connector for a narrow pitch 20 related to the present invention. In addition, such connector for a narrow pitch is used so that short circuit at the time of junction can be prevented and reliability of the micro-pump of its own can be improved.

Embodiment 11

FIG. 20 is an exploded perspective view showing a main portion of the optical modulation device as another example related to the present embodiment.

This optical modulation device is configured roughly by comprising a silicon substrate 140, a glass substrate 150 and a cover substrate 170.

The silicon substrate 140 has micro-mirrors 141 arranged like a matrix. Among these micro-mirrors 141, the micro-mirrors 141 arranged along in one direction, for example, in the direction of X in FIG. 20 are linked with torsion bars 143. Moreover, a frame-like section 145 is provided to encircle the region in which micro-mirrors 141 are disposed. This frame-like section 145 is respectively linked with both the ends of the torsion bars 143. In addition, in a micro-mirror 141, slits are formed around the linking portion with a torsion bar 143, and formation of this slit will make it easy to implement inclined operation of the torsion bar 143 in the direction along its axial periphery. Moreover, a reflection layer 141a is formed on the surface of a micro-mirror 141. In addition, the micro-mirror 141 undergoes inclined operation so that the reflecting direction of light incident on this micro-mirror 141 varies. In addition, a period of time for which the light is reflected toward a predetermined reflection direction is controlled so that the optical modulation can be implemented. A circuit to cause this micro-mirror 141 to undergo inclined operation is formed in the glass substrate 150.

The glass substrate 150 has a concave portion 151 in the central region and has an uprising section 153 surrounding it. One side of uprising section 153 is cut apart to be as an electrode output orifice 155, and outside this electrode output orifice 155, an electrode output plate section 157 in series with the concave portion 151 is formed. In addition, the concave portion 151 of the glass substrate 150 has a number of supports 159 formed to protrude from the concave portion 151 in the position facing the torsion bar 143 between adjacent two micro-mirrors 141 in the direction of X and having the same height as the ceiling of the uprising section 153. Moreover, a wiring pattern section 161 is formed on the concave portion 151 of the glass substrate 150 and the electrode output plate section 157. This wiring pattern section 161 has a first and a second address electrodes 163 and 165 respectively in the positions facing the rear surface of the micro-mirror 141 at the both sides bridged by the torsion bar 143. In addition, the first address electrode 163 arranged along in the direction of Y is brought into common connection with a first common wiring 167. Likewise, the second address electrode 165 arranged along in the direction of Y is brought into common connection with a second common wiring 169.

The silicon substrate 140 is brought into anodic junction on the glass substrate 150 having the above described configuration. At this time, both the end portions of the torsion bar 143 of the silicon substrate 140, the frame-like section 145, and the uprising section 153 of the glass substrate 150 are brought into junction. Moreover, the middle section of the torsion bar 143 of the silicon substrate 140 and the support section 159 of the glass substrate 150 are brought into anodic junction. Moreover, thereafter, the cover substrate 170 is brought into junction on the frame-like section 145 of the silicon substrate 140. In addition, both the end portions of the respective torsion bars 143 which are linked with the frame-like section 145 undergo dicing in the positions where they are cut off from the frame-like section 145. Moreover, the circumference section including the electrode output orifice 155 cut apart to be formed in the uprising section 153 of the glass substrate 150 is tightly sealed with a sealing material so that the optical modulation device is completed.

In addition, signals from outside is inputted into the first common wiring 167 and the second common wiring 169 of the completed optical modulation device by the optical modulation device, as in the above described Embodiments 6 to 10, subject to connection with a bending substrate such as a tape carrier package on which a drive IC is mounted via the connector for a narrow pitch related to the present invention.

Thus the connector for a narrow pitch is used so that short circuit at the time of junction can be prevented and reliability of the optical modulation device of its own can be improved.

Incidentally, even for an optical modulation device that has micro-mirrors and active elements to control the micro-mirrors to be formed and has a configuration similar to the above described configuration, the connector for a narrow pitch of the present invention can be used.

Embodiment 12

FIG. 21 is an explanatory view showing an example of a liquid crystal panel related to the Embodiment 11 of the present invention, which shows a state of a module, that is the state after completion of the array step and the cell step and before electronic circuits of the drive system are installed so that the liquid crystal cell can undergo electrical control. That is, the liquid crystal panel 180 comprises a liquid crystal cell 181, a connector for a narrow pitch 182 and a tape carrier package 184 on which a drive IC 183 is mounted.

Incidentally, the connector for a narrow pitch 182 for this example is different from the connector for a narrow pitch 20 in the Embodiment 1, and only wiring pattern is formed, and the driver IC is not mounted. However, other configurations are basically the same as in the connector for a narrow pitch 20, and on the outer periphery thereof, a step section 189 having an insulating layer is formed.

The liquid crystal cell 181 comprises two substrates, for example, the substrate 181a and 181b, between which a liquid crystal material is injected and sealed, and on one substrate 181a (the substrate located in the upper position in FIG. 21) pixel electrodes, a thin film transistor configured by being brought into connection with the pixel electrodes, the source of the thin film transistor, the source line configured by being brought into electrical connection with the gate, and a data line, etc, are formed and on the other substrate 181b (the substrate located in the lower position in FIG. 21), for example, facing electrodes and color filter, etc., are disposed.

In addition, in the module step, terminal electrodes 185 formed in the liquid crystal cell 181 and terminal electrodes 186 of narrow pitch of the connector for a narrow pitch 182 are overlapped, or these terminal electrodes 185 and the terminal of narrow pitch 27a are overlapped with a conductive member being sandwiched between them so as to be brought into connection by pressuring and heating.

In addition, the terminal electrodes 187 at the end of the wiring pattern enlarged and elongated from the other end of the terminal of narrow pitch 186 of the connector for a narrow pitch 182 are brought into connection with terminals 188 of the tape carrier package 184, and thereby the terminal electrodes 185 and the drive IC 183 are arranged to be brought into conduction.

Also in this example, as in the above described embodiment, the connector for a narrow pitch 182 having a step section 189 having insulating layer on the outer periphery surface is used so that short circuit at the time of junction can be prevented and reliability of the liquid crystal panel of its own can be improved.

Embodiment 13

FIG. 22 shows a portable telephone as an example of an electronic appliance utilizing the liquid crystal panel shown in the Embodiment 11.

The liquid crystal panel is used for the display section 191 of the portable telephone 190 shown in FIG. 22. In addition, a. highly reliable liquid crystal panel using the above described connector for a narrow pitch 182 is used so that improvement in reliability of the portable telephone 190 of its own can be realized.

What is claimed is:

1. A manufacturing method of semiconductor devices in which a silicon wafer undergoes dicing to manufacture plural semiconductor devices, comprising:

forming a groove spanning a dicing line in said silicon wafer;

forming a metal film on an insulating layer after said insulating layer is formed on a bottom surface of said groove, said metal film being brought into conduction to a crystal face of said silicon wafer; and dicing said silicon wafer along said dicing line.

2. The manufacturing method of semiconductor devices according to claim 1, wherein the crystal face on the surface of said silicon wafer is a (100)-plane and said groove is formed by implementing anisotropy etching on the (100)-plane.

3. The manufacturing method of semiconductor devices according to claim 1, wherein the crystal face on the surface of said silicon wafer is a (110)-plane and said groove is formed by implementing anisotropy etching on the (110)-plane.

* * * * *